United States Patent
Park et al.

(10) Patent No.: US 7,522,440 B2
(45) Date of Patent: Apr. 21, 2009

(54) DATA INPUT AND DATA OUTPUT CONTROL DEVICE AND METHOD

(75) Inventors: Moon-Sook Park, Seoul (KR); Kyu-Hyoun Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 11/430,281

(22) Filed: May 9, 2006

(65) Prior Publication Data
US 2007/0008797 A1    Jan. 11, 2007

(30) Foreign Application Priority Data
Jul. 5, 2005    (KR) .............. 10-2005-0060444

(51) Int. Cl.
*G11C 5/02*    (2006.01)
(52) U.S. Cl. .............. 365/51; 365/189.02; 365/191; 365/219
(58) Field of Classification Search ............... 365/219, 365/220, 221; 341/100, 101; 710/71; 370/368
See application file for complete search history.

(56) References Cited

U.S. PATENT DOCUMENTS

| | | | |
|---|---|---|---|
| 5,426,606 A | 6/1995 | Takai | |
| 6,122,220 A | 9/2000 | Kim et al. | |
| 6,169,501 B1 | 1/2001 | Ryan | |
| 6,378,020 B2 | 4/2002 | Farmwald et al. | |
| 6,453,381 B1 | 9/2002 | Yuan et al. | |
| 6,526,537 B2 | 2/2003 | Kishino | |
| 6,697,992 B2 | 2/2004 | Ito et al. | |
| 6,807,598 B2 | 10/2004 | Farmwald et al. | |
| 6,816,433 B2 | 11/2004 | Toda | |
| 2002/0005793 A1 | 1/2002 | Koga | |
| 2002/0062458 A1* | 5/2002 | Maeno | 714/6 |
| 2002/0098421 A1 | 7/2002 | Hasegawa et al. | |
| 2003/0188088 A1 | 10/2003 | Kootstra | |

FOREIGN PATENT DOCUMENTS

| | | |
|---|---|---|
| JP | 07-312098 A | 11/1995 |
| JP | 2003-085996 A | 3/2003 |
| KR | 10-1998-019814 A | 6/1998 |
| TW | 452799(B) | 9/2001 |
| TW | 479260(B) | 3/2002 |

OTHER PUBLICATIONS

Search Report mailed by the Taiwan Intellectual Property Office on Dec. 22, 2008, for Taiwanese Patent Application No. 095121372.

* cited by examiner

*Primary Examiner*—Anh Phung
*Assistant Examiner*—Harry W Byrne
(74) *Attorney, Agent, or Firm*—Harness, Dickey & Pierce, P.L.C.

(57) ABSTRACT

A data input and data output control device and method in which a plurality of write or read data composed of m ($2^n$+k) bits (where m, n, and k are all integers) may be accessed within one clock of external input clock.

24 Claims, 25 Drawing Sheets

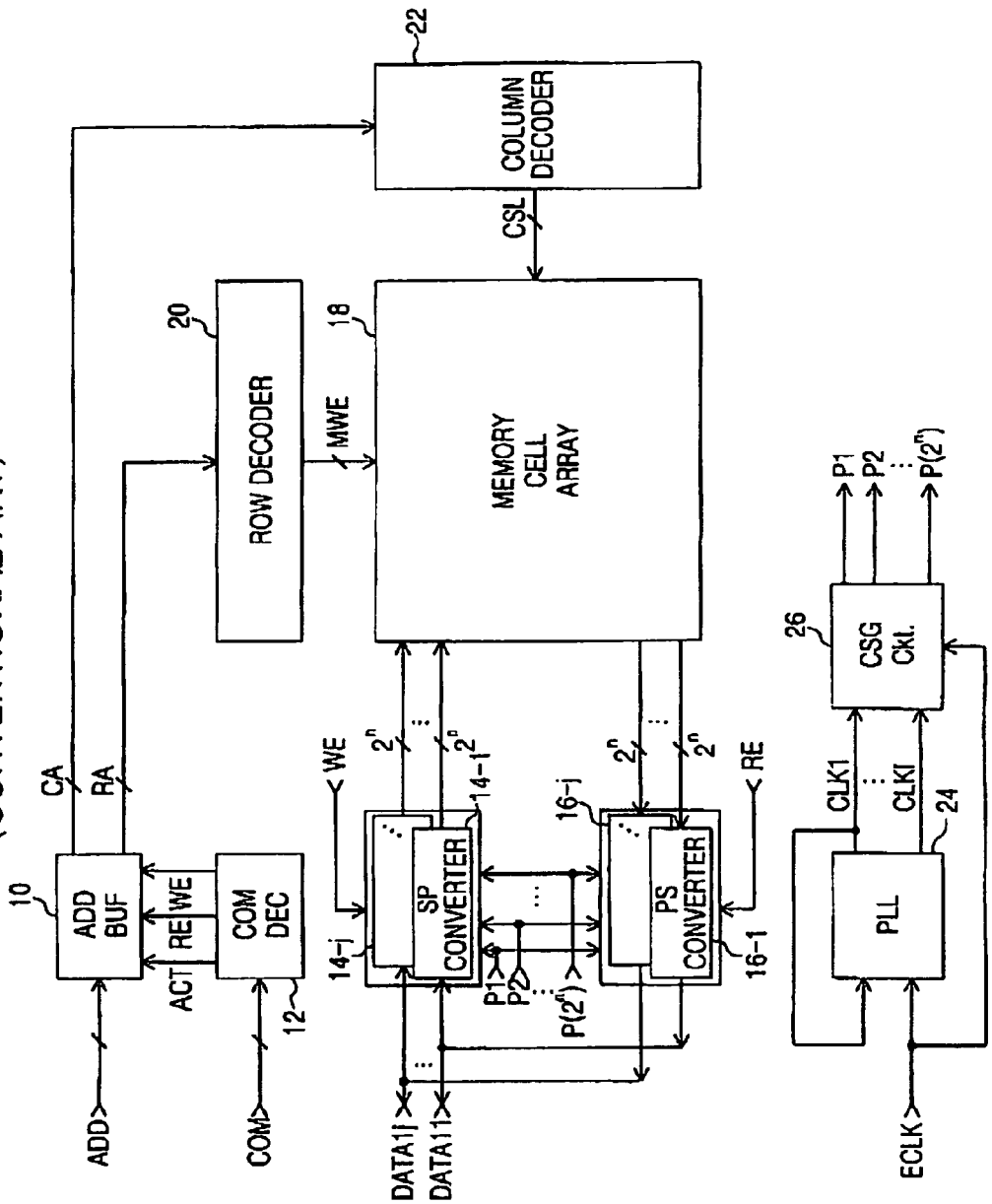

DATA INPUT AND DATA OUTPUT CONTROL DEVICE AND METHOD

PRIORITY STATEMENT

This U.S. non-provisional application claims priority under 35 U.S.C. § 119 to Korean Patent Application No. 10-2005-0060444, filed on Jul. 5, 2005, in the Korean Intellectual Property Office (KIPO), the entire contents of which are incorporated herein by reference.

BACKGROUND OF THE INVENTION

FIG. 1A illustrates an example of a conventional memory system. As shown, a conventional memory system may include a memory controller 100 and a memory module 200. The memory module 200 may further include a plurality of memory devices 200-1, 200-2, 200-x, which may be implemented, for example, by DRAMs.

The memory controller 100 may output an external clock signal ECLK, one or more command signals COM such as a row address strobe signal RASB, a column address strobe signal CASB, a write enable signal WEB and a chip select signal CSB, one or more address signals ADD, and/or one or more data signals DATA to the memory module 200.

The memory module 200 may also output one or more data signals DATA to the memory controller 100. In the example shown in FIG. 1A, the one or more data signals DATA may be composed of a serial stream of $2^n$ bits, represented by $[1:2^n]$ DATA11 to $[1:2^n]$ DATAxj. As shown in FIG. 1A, a memory device 200-1 may receive the external clock signal ECLK, the one or more command signals COM, the one or more address signals ADD, and the DATA signals DATA 11 to DATA 1j. Similarly, a memory device 200-2 may receive the external clock signal ECLK, the one or more command signals COM, the one or more external address signals ADD, and the DATA signals DATA 21 to DATA 2j, and a memory device 200-x may receive the external clock signal ECLK, the one or more command signals COM, the one or more address signals ADD, and the DATA signals DATA x1 to DATA xj.

As shown, in the conventional memory system of FIG. 1A, each memory device 200-1, 200-2, 200-x may receive or output DATA composed of serial $2^n$ bits during one clock cycle of the external clock signal ECLK. In addition, DATA of j bits may be written or read at the same time.

FIG. 1B illustrates an example of a conventional memory device, for example the memory device 200-1 of FIG. 1A, and associated control logic. As shown, the associated control logic may include an address buffer (ADD BUF) 10, a command decoder (COM DEC) 12, one or more serial-to-parallel converters 14-1 to 14-j (a corresponding to the j in FIG. 1A), one or more parallel-to-serial converters 16-1 to 16-j, the memory cell array 18, a row decoder 20, a column decoder 22, a PLL 24, and/or a control signal generation circuit (CSG Ckt.) 26.

The address buffer (ADD BUF) 10 may receive external input addresses (ADD) to generate row addresses (RA), supplied to the row decoder 20, in response to an active command signal (ACT). That is, the address buffer (ADD BUF) 10 may comprise a plurality of address buffer circuits, each of which receives one external address signal to generate one row address signal (RA). Accordingly, if the memory device 200-1 receives twelve external addresses (ADD) from the memory controller 100, the address buffer 10 comprises twelve address buffer circuits for receiving twelve external addresses and generating twelve row addresses (RA).

The row decoder 20 may activate a main word line enable signal (MWE) corresponding to a plurality of row addresses generated from a plurality of row address buffers so that a desired word line (not shown) may be selected in the memory cell array 18. The address buffer (ADD BUF) 10, which may include a plurality of address buffer circuits for a plurality of external address signals, may also generate a plurality of column addresses (CA), supplied to the column decoder 22, in response to a read command (RE) or a write command (WE) decoded from the one or more command signals COM.

The column decoder 22 may receive a plurality of column addresses to activate a corresponding column select line (CSL). A plurality of bit lines of the memory cell array 18 may be selected in response to the selected CSL so that a plurality of data may be written to or read from the selected memory cells.

As set forth above, the command decoder 12 may generate an active command (ACT), a read command (RE), and a write command (WE) after receiving a plurality of external command signals (COM), for example, RASB, CASB, WEB etc.

Each serial-to-parallel converter (14-1 to 14-j) may receive serial data DATA composed of $2^n$ bit data and output $2^n$ bit parallel data through $2^n$ data bus lines simultaneously to the memory cell array 18, in response to a write command signal (WE) and a plurality of control signals (P1~P($2^n$)). If the number of data input/data output pins (DQ) is j, the number of serial-to-parallel converter is also j. In addition, each of the serial-to-parallel converters (14-1 to 14-j) may be coupled to the memory cell array 18 via $2^n$ data bus lines.

Each parallel-to-serial converter (16-1 to 16-j) may receive $2^n$ bit data from a memory cell array 18 in parallel and output $2^n$ bit serial data responsive to a read command signal (RE) and the plurality of control signals (P1~P($2^n$)). If the number of data input/data output pins (DQ) is j, the number of parallel-to-serial converters is also j.

The phase lock loop 24 may receive the external clock signal ECLK and perform a locking operation to output an internal clock signal CLK1, which is locked with ECLK. After completing the locking operation, the phase lock loop 24 may output a plurality of internal clock signals (CLK1~CLK1) to the control signal generation circuit (CSG Ckt.) 26. The control signal generation circuit (CSG Ckt.) 26 may generate the plurality of control signals (P1~P($2^n$)).

A disadvantage of a conventional data access technique, such as the one described above, is that it is possible to access only $2^n$ bits of data, for example, 2 bits, 4 bits, 8 bits, etc., during one clock cycle of an external clock signal, for example ECLK.

FIG. 2A illustrates operation of a conventional PLL and control signal generation circuit, for example, PLL 24 and control signal generation circuit (CSG Ckt.) 26 of FIG. 1B. As shown, an internal clock signal CLK1 may be locked with an external clock signal ECLK. The PLL may generate two (or more) internal clocks CLK1/CLK2 which may have twice the frequency of ECLK. A phase difference between CLK1 and CLK2 may be 180°. The control signal generation circuit (CSG Ckt.) 26 may generate four control signals P1~P4 using various combinations of the two internal clocks CLK1~CLK2 and ECLK. Accordingly, four data D1-D4 may be written or read through serial-to-parallel converters or parallel-to-serial converters, responsive to each of P1~P4 during one clock cycle of ECLK. Such a memory device may be said to be operating with a quad data rate (QDR).

FIG. 2B illustrates another operation of a conventional PLL and control signal generation circuit, for example, PLL 24 and control signal generation circuit (CSG Ckt.) 26 of FIG. 1B. As shown, the internal clock signal CLK1 may be locked with ECLK. The PLL may generate four internal clocks CLK1~CLK4 which have the same frequency as ECLK. A phase difference between adjacent clocks may be 90°. The control signal generation circuit (CSG Ckt.) 26 may generate four control signals P1~P4 using various combinations of the four internal clocks CLK1~CLK4 and ECLK to access four data D1-D4 from a memory device during one clock cycle of the external clock ECLK. Such a memory device may be also said to be operating with a quad data rate (QDR).

FIG. 3 illustrates yet another operation of a conventional PLL and control signal generation circuit, for example, PLL 24 and control signal generation circuit (CSG Ckt.) 26 of FIG. 1B. As shown, the internal clock signal CLK1 may be locked with ECLK. The PLL may generate four internal clocks CLK1~CLK4 which have twice the frequency of ECLK. A phase difference between adjacent clocks may be 90°. The control signal generation circuit (CSG Ckt.) 26 may generate eight control signals P1~P8 using various combinations of the four internal clocks CLK1 ~ CLK4 and ECLK to access eight data D1-D8 from a memory device during one clock cycle of the external clock ECLK. Such a memory device may be said to be operating with an octal data rate (ODR).

A disadvantage of conventional data access techniques, such as those described above, is that it is possible to access only $2^n$ bits of data, for example, 2 bits, 4 bits, 8 bits, etc., during one clock cycle of external clock signal.

Therefore, a conventional semiconductor device may include extra pins or pads for receiving and/or outputting data bits for error correction coding (ECC), cyclic redundancy coding (CRC) or data masking (DM). This may require a large chip area and, hence, increase manufacturing cost.

SUMMARY OF THE INVENTION

Example embodiments of the present invention are directed to data input and data output control devices and data input and data output control methods.

Example embodiments of the present invention are directed to serial to parallel converters, methods of converting a serial bit stream into a parallel stream, parallel to serial converters, methods for converting a parallel bit stream into a serial bit stream, control signal generator circuits, methods of generating a control signal, memory devices, methods of writing data to and reading data from a memory cell array, memory systems, and methods of writing data to and reading data from a memory device.

Example embodiments of the present invention are directed to data input and data output control devices and data input and data output control methods which may input and/or output more data in one clock cycle.

Example embodiments of the present invention are directed to data input and data output control devices and data input and data output control methods which may input and/or output additional data on the same bus.

Example embodiments of the present invention are directed to data input and data output control devices and data input and data output control methods where the additional data may be transferred from a memory controller to a memory and/or from the memory to the memory controller.

Example embodiments of the present invention are directed to data input and data output control devices and data input and data output control methods where the additional data is error correction data, for example, CRC or parity check data.

Example embodiments of the present invention are directed to data input and data output control devices and data input and data output control methods where the additional data is mask data.

Example embodiments of the present invention are directed to data input and data output control devices and data input and data output control methods where the additional data is memory controller or memory status information, for example, temperature information.

Example embodiments of the present invention are directed to data input and data output control devices and data input and data output control methods where the additional data is dummy data.

Example embodiments of the present invention are directed to data input and data output control devices and data input and data output control methods in which a plurality of write or read data composed of m (2n+k) bits (where m, n, and k are all integers) may be accessed within one clock of external input clock.

Example embodiments of the present invention are directed to data input and data output control devices and data input and data output control methods which require less chip area and/or lower manufacturing cost.

In an example embodiment of the present invention, a serial to parallel converter for converting a serial bit stream of m (where m is an integer$\geq$3) bits into a parallel m-bit stream, where the m bits include 2n data bits (where n is an integer$\geq$1) and k data bits (where k is an integer$\geq$1) may include a first register array of (m−1) registers, each for sequentially receiving bits 1 through (m−1) of the serial bit stream of m bits and (m−1) control signals, each of the (m−1) registers of the first register array storing and outputting bits 1 through (m−1) of the serial bit stream of m bits as (m−1) first register array outputs, each of the (m−1) first register array outputs being output during one clock cycle of an external clock signal supplied to the serial to parallel converter and a second register array of m registers, each for sequentially receiving the (m−1) first register array outputs and the mth control signal, each of the m registers of the second register array storing and outputting bits 1 through m as m second register array outputs at the same time, all of the m second register array outputs being output during one clock cycle of the external clock signal.

In an example embodiment of the present invention, a method of converting a serial bit stream of m (where m is an integer$\geq$3) bits into a parallel m-bit stream, where the m bits include 2n data bits (where n is an integer$\geq$1) and k data bits (where k is an integer$\geq$1) may include sequentially receiving bits 1 through (m−1) of the serial bit stream of m bits and (m−1) control signals, storing and outputting bits 1 through (m−1) of the serial bit stream of m bits as (m−1) first outputs, each of the (m−1) first outputs being output during one clock cycle of an external clock signal, sequentially receiving the (m−1) first outputs and the mth control signal, and storing and outputting bits 1 through m as m second outputs at the same time, all of the m second outputs being output during one clock cycle of the external clock signal.

In an example embodiment of the present invention, a parallel to serial converter for converting a parallel bit stream of m bits (where m is an integer$\geq$3) bits into a serial bit stream of m bits, where the m bits include 2n data bits (where n is an integer$\geq$1) and k data bits (where k is an integer$\geq$1) may include a logic gate array of m logic gates, each for concurrently receiving bits 1 through m of the parallel bit stream of m bits and m control signals, each of the m logic gates sequentially outputting bits 1 through m of the serial bit stream of m bits, in response to each of the m control signals, as m logic gate array outputs, all of the m logic gate array outputs being output during one clock cycle of an external clock signal supplied to the parallel to serial converter and a logic gate for sequentially receiving the m logic gate array outputs and outputting bits 1 through m as a serial bit stream of m bits, all of the bits 1 through m being output during one clock cycle of the external clock signal.

In an example embodiment of the present invention, a method for converting a parallel bit stream of m bits (where m is an integer$\geq 3$) bits into a serial bit stream of m bits, where the m bits include 2n data bits (where n is an integer$\geq 1$) and k data bits (where k is an integer$\geq 1$) may include concurrently receiving bits 1 through m of the parallel bit stream of m bits and m control signals, sequentially outputting bits 1 through m of the serial bit stream of m bits, in response to each of the m control signals, as m first outputs, all of the m first being output during one clock cycle of an external clock signal, and sequentially receiving the m first outputs and outputting bits 1 through m as a serial bit stream of m bits, all of the bits 1 through m being output during one clock cycle of the external clock signal.

In an example embodiment of the present invention, a control signal generator circuit may include a logic circuit for receiving at least two internal clock signals and generating p control signals (where p is an integer$\geq 3$) and where p=2n+k, where 2n is a number of data bits (where n is an integer$\geq 1$) and k is a number of data bits (where k is an integer$\geq 1$), all of the p control signals being generated sequentially during one clock cycle of an external clock signal.

In an example embodiment of the present invention, a method of generating a control signal may include receiving at least two internal clock signals and generating p control signals (where p is an integer$\geq 3$) and where p=2n+k, where 2n is a number of data bits (where n is an integer$\geq 1$) and k is a number of data bits (where k is an integer$\geq 1$), all of the p control signals being generated sequentially during one clock cycle of an external clock signal.

In an example embodiment of the present invention, a memory device may include a memory cell array, a control signal generator circuit for receiving at least two internal clock signals and generating p control signals (where p is an integer$\geq 3$) and where p=2n+k, where 2n is a number of data bits (where n is an integer$\geq 1$) and k is a number of data bits (where k is an integer$\geq 1$), all of the p control signals being generated sequentially during one clock cycle of an external clock signal, at least one serial to parallel converter, for receiving a serial bit stream of m (where m is an integer$\geq 3$) bits sequentially, and converting the serial bit stream of m bits into a parallel bit stream in response to each of the p control signals, all bits of the parallel bit stream being output during one clock cycle of the external clock signal, where at least the 2n data bits can be written to the memory cell array, and at least one parallel to serial converter, for receiving at least a parallel 2n-bit stream read from the memory cell array and converting the parallel 2n-bit stream into a serial bit stream in response to each of the 2n control signals, all bits of the serial bit stream being output during one clock cycle of the external clock signal, where at least the 2n data bits can be read from the memory cell array.

In an example embodiment of the present invention, a method of writing data to and reading data from a memory cell array may include receiving at least two internal clock signals and generating p control signals (where p is an integer$\geq 3$) and where p=$2^n$+k, where $2^n$ is a number of data bits (where n is an integer$\geq 1$) and k is a number of data bits (where k is an integer$\geq 1$), all of the p control signals being generated sequentially during one clock cycle of an external clock signal, receiving a serial bit stream of m (where m is an integer$\geq 3$) bits sequentially, and converting the serial bit stream of m bits into a parallel bit stream in response to each of the p control signals, all bits of the parallel bit stream being output during one clock cycle of the external clock signal, where at least the $2^n$ data bits can be written to the memory cell array, and receiving at least a parallel $2^n$-bit stream read from the memory cell array and converting the parallel $2^n$-bit stream into a serial bit stream in response to each of the $2^n$ control signals, all bits of the serial bit stream being output during one clock cycle of the external clock signal, where at least the $2^n$ data bits can be read from the memory cell array.

In an example embodiment of the present invention, a memory system may include a memory including a plurality of memory devices, each memory device including a memory cell array, each memory device including a control signal generator circuit for receiving at least two internal clock signals and generating p control signals (where p is an integer$\geq 3$) and where p=$2^n$+k, where $2^n$ is a number of data bits (where n is an integer$\geq 1$) and k is a number of data bits (where k is an integer$\geq 1$), all of the p control signals being generated sequentially during one clock cycle of an external clock signal, at least one serial to parallel converter, for receiving a serial bit stream of m (where m is an integer$\geq 3$) bits sequentially, and converting the serial bit stream of m bits into a parallel bit stream in response to each of the p control signals, all bits of the parallel bit stream being output during one clock cycle of the external clock signal, where at least the $2^n$ data bits can be written to the memory cell array, and at least one parallel to serial converter, for receiving at least a parallel $2^n$-bit stream read from the memory cell array and converting the parallel $2^n$-bit stream into a serial bit stream in response to each of the $2^n$ control signals, all bits of the serial bit stream being output during one clock cycle of the external clock signal, where at least the $2^n$ data bits can be read from the memory cell array and a memory controller supplying the external clock signal to a phased locked loop of each of the plurality of memory devices so each of the phased locked loops may generate the at least two internal clock signals provided to the control signal generator circuit and supplying a command signal and an address signal to read the at least $2^n$ data bits from any of the plurality of memory devices and write the at least $2^n$ data bits to any of the plurality of memory devices.

In an example embodiment of the present invention, a method of writing data to and reading data from a memory, including a plurality of memory devices and a memory controller may include supplying an external clock signal to each of the plurality of memory devices, generating at least two internal clock signals from the external clock signal, generating p control signals (where p is an integer$\geq 3$) and where p=2n+k, where 2n is a number of data bits (where n is an integer$\geq 1$) and k is a number of data bits (where k is an integer$\geq 1$), all of the p control signals being generated sequentially during one clock cycle of an external clock signal, receiving a serial bit stream of m (where m is an integer$\geq 3$) bits sequentially from the memory controller, and converting the serial bit stream of m bits into a parallel bit stream in response to each of the p control signals, all bits of the parallel bit stream being output during one clock cycle of the external clock signal, supplying a write command signal and an address signal to write at least the 2n data bits to at least one of the plurality of memory devices, receiving at least a parallel 2n-bit stream read from one of the plurality of memory devices and converting the parallel 2n-bit stream into a serial bit stream in response to each of the 2n control signals, all bits of the serial bit stream being output during one clock cycle of the external clock signal, and supplying a read command signal and an address signal to read at least the 2n data bits from at least one of the plurality of memory devices.

Example embodiments of the present invention are directed to data input and data output control devices and data input and data output control methods where there is a one-to-one correspondence between the number of internal clock signals generated, a number of inverter circuits utilized, and a number of control signals generated. In other example embodiments, there is not a one-to-one correspondence between the number of internal clock signals generated, a number of inverter circuits utilized, or a number of control signals generated. In some example embodiments, the number of control signals generated is greater than the number of internal clock signals generated.

BRIEF DESCRIPTION OF THE DRAWINGS

The present invention will become more fully understood from the detailed description of example embodiments provided below and the accompanying drawings, which are given for purposes of illustration only, and thus do not limit the invention.

FIG. 1B illustrates an example of a conventional memory device.

Figure 1A:
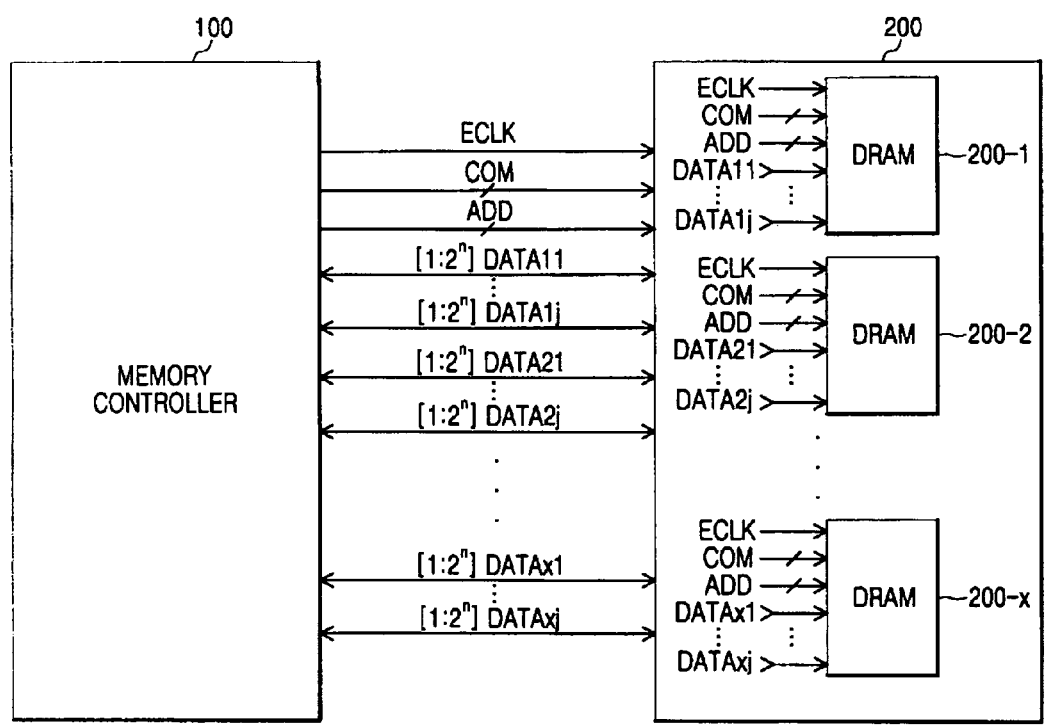
FIG. 1A illustrates an example of a conventional memory system.
Figure 2A:
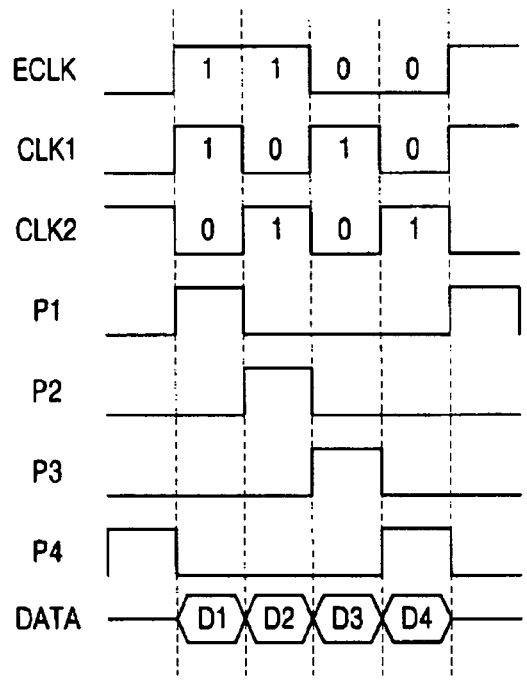
FIG. 2A illustrates operation of a conventional PLL and control signal generation circuit.
Figure 2B:
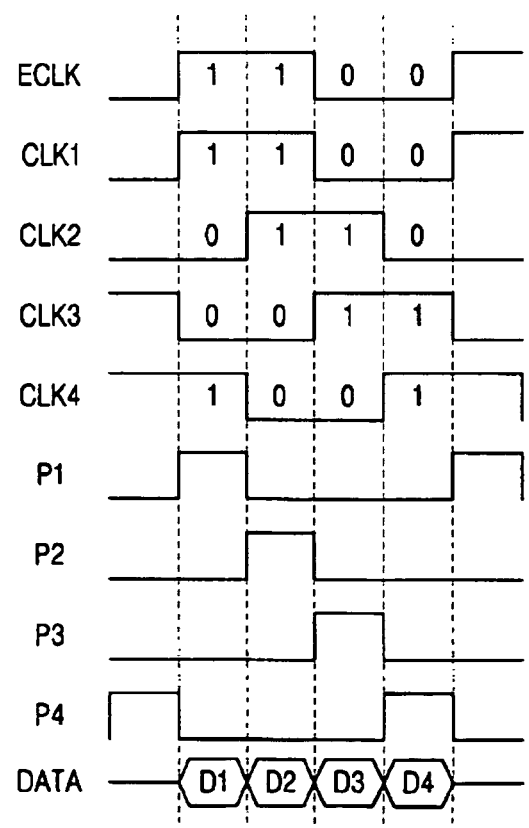
FIG. 2B illustrates another operation of a conventional PLL and control signal generation circuit.
Figure 3:
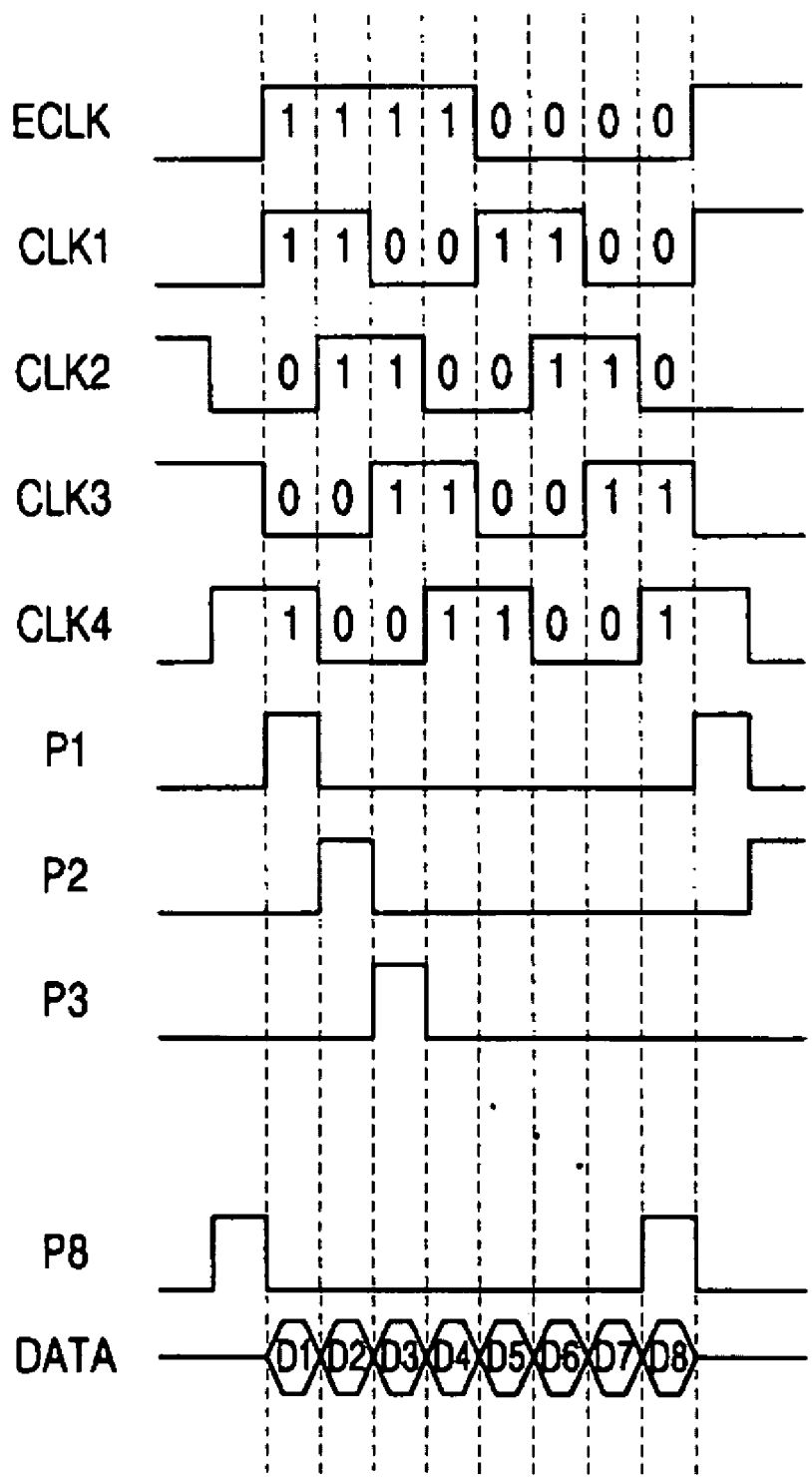
FIG. 3 illustrates yet another operation of a conventional PLL and control signal generation circuit.

It should be noted that these Figures are intended to illustrate the general characteristics of methods and devices of example embodiments of this invention, for the purpose of the description of such example embodiments herein. These drawings are not, however, to scale and may not precisely reflect the characteristics of any example embodiment, and should not be interpreted as defining or limiting the range of values or properties of example embodiments within the scope of this invention.

DETAILED DESCRIPTION OF EXAMPLE EMBODIMENTS

Various example embodiments of the present invention will now be described more fully with reference to the accompanying drawings in which some example embodiments of the invention are shown.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. or numbers 1, 2, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the description. For example, two functions/acts described in succession may in fact be executed substantially concurrently or may sometimes be executed in the reverse order, depending upon the functionality/acts involved.

Figure 4:
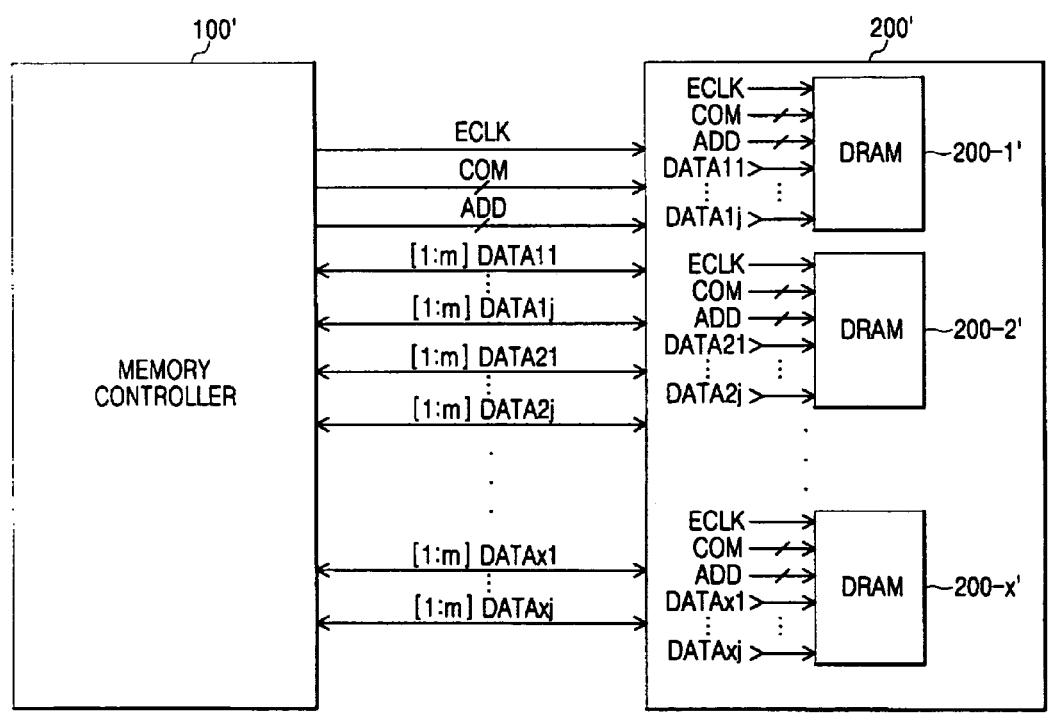
FIG. 4 illustrates a memory system in accordance with an example embodiment of the present invention.

FIG. 4 illustrates a memory system in accordance with an example embodiment of the present invention. As shown, a memory system in accordance with an example embodiment of the present invention may include a memory controller 100' and a memory module 200' in which a plurality of memory devices 200-1', 200-2', 200-x', are mounted on a module board. As shown, the memory controller 100' and the memory module 200' exchange one or more data signals DATA. In the example shown in FIG. 4, the one or more data signals DATA may be composed of a serial stream of m bits, represented by [1:m] DATA11 to [1:m] DATAxj, where m is described in more detail below.

As illustrated, each memory device 200-1', 200-2', 200-x' may receive or output DATA composed of a serial stream of m bits, where m =($2^n$+k) bits instead of $2^n$ bits, during one clock cycle of an external clock ECLK. In an example embodiment, all of the $2^n$=k data bits may be valid data writable to and readable from a memory cell array. In example embodiments, n is an integer$\geq$1, k is an integer $\geq$1, and m is an integer $\geq$3. In example embodiments, m may be an integer power of 2 (e.g., 2, 4, 8, 16, 32, . . . ). For example, if n=1 and k=2, then m=4. In example embodiments, m may be other than an integer power of 2(e.g., 3, 5, 6, 7, 9, 10, 11, 12, 13, 14, 15, 17, 18, . . . ). For example, if n=1 and k=1, then m =3. For example, if k is <$2^n$, then m <$2^n$+$2^n$=2 * $2^n$=$2^{n+1}$, and m is not an integer power of 2.

Figure 5:
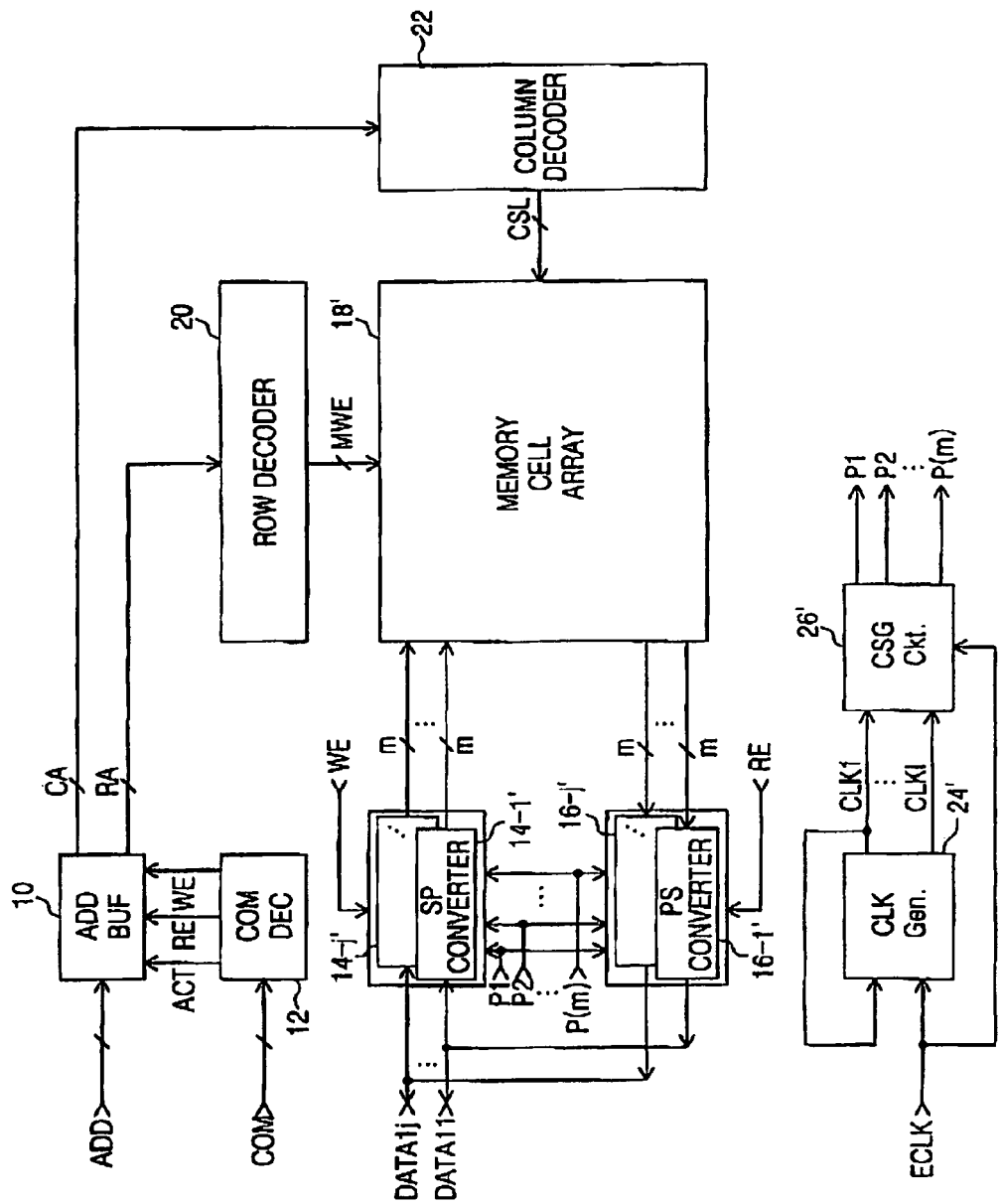
FIG. 5 illustrates a memory device in accordance with an example embodiment of the present invention.

FIG. 5 illustrates a memory device including associated control logic in accordance with an example embodiment of the present invention. As shown, the associated control logic may include one or more serial-to-parallel converters 14-1' to 14-j', one or more parallel-to-serial converters 16-1' to 16-j', a memory cell array 18', a clock generator (CLK Gen.) 24', and/or a control signal generation circuit (CSG Ckt.) 26'. The associated control logic may also include the conventional address buffer (ADD BUF) 10, command decoder (COM DEC) 12, row decoder 20, and/or column decoder 22 of FIG. 1B.

Each serial-to-parallel converter (14-1' to 14-j') may receive serial data DATA composed of m bit data and output m bit parallel data through m data bus lines simultaneously to the memory cell array 18', in response to a write command signal (WE) and a plurality of control signals (P1 ~P(m)). In addition, each of the serial-to-parallel converters (14-1' to 14-j') may be coupled to the memory cell array 18' via m data bus lines.

Each parallel-to-serial converter (16-1' to 16-j ') may receive m bit data from the memory cell array 18' in parallel and output m bit serial data responsive to a read command signal (RE) and the plurality of control signals (P1~P(m)).

The clock generator (CLK Gen.) 24' may receive the external clock signal ECLK and perform a locking operation to output an internal clock signal CLK1, which is locked with ECLK. After completing the locking operation, the clock generator (CLK Gen.) 24' may output a plurality of internal clock signals (CLK1~CLK1) to the control signal generation circuit (CSG Ckt.) 26'. The control signal generation circuit (CSG Ckt.) 26' may generate the plurality of control signals (P1~P(m)).

As shown in FIG. 5, the control signal generation circuit (CSG Ckt.) 26' generates a plurality of control signals (P1~P (m)). In an example embodiment, m=$2^n$+k. As a result, in an example embodiment of the present invention, one or more serial-to-parallel converters (14-1' to 14-j') and/or one or more parallel-to-serial converters (16-1' to 16-j') may also convert m data bits into a parallel or serial stream during one clock cycle of ECLK, in response to one or more control signals (P1~P(m)).

Figure 6:
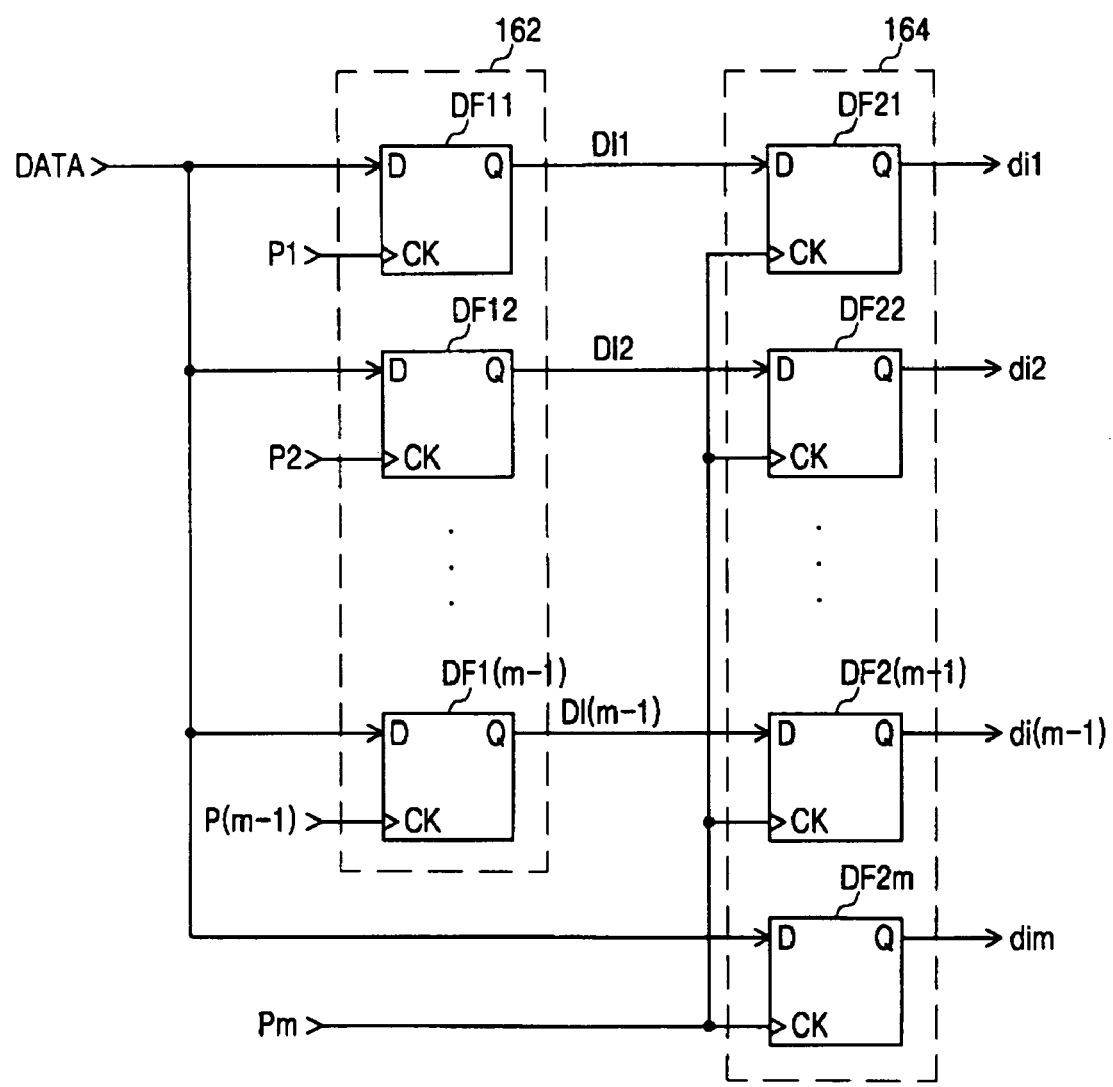
FIG. 6 illustrates a serial-to-parallel converter in accordance with an example embodiment of the present invention.

FIG. 6 illustrates a serial-to-parallel converter, for example, a serial-to-parallel converter (14-j') in accordance with an example embodiment of the present invention. The serial-to-parallel converter (14-j') may include a first flip flop part 162, including m-1 flip flops (for example, D flip-flops DFL 11~DF1(m-1)), and a second flip flop part 164, including m flip flops (for example, D flip-flops DF21 DF2m). Each of the m-1 flip flops (DF11~DFl(m-l)) may store corresponding input data from a serial data stream DATA in response to a rising edge of one or more control signals (P1~P(m- 1)) and may output a plurality of data DI1, D12 DI(m-1), respectively.

Each of m flip flops (DF21~DF2m) may store m−1 output data from the first flip flop part 162 as well as a last input data simultaneously responsive to the rising edge of the control signal Pm and may output all data (di1~dim) to a memory cell array (for example, memory cell array 18') in parallel.

Figure 7:
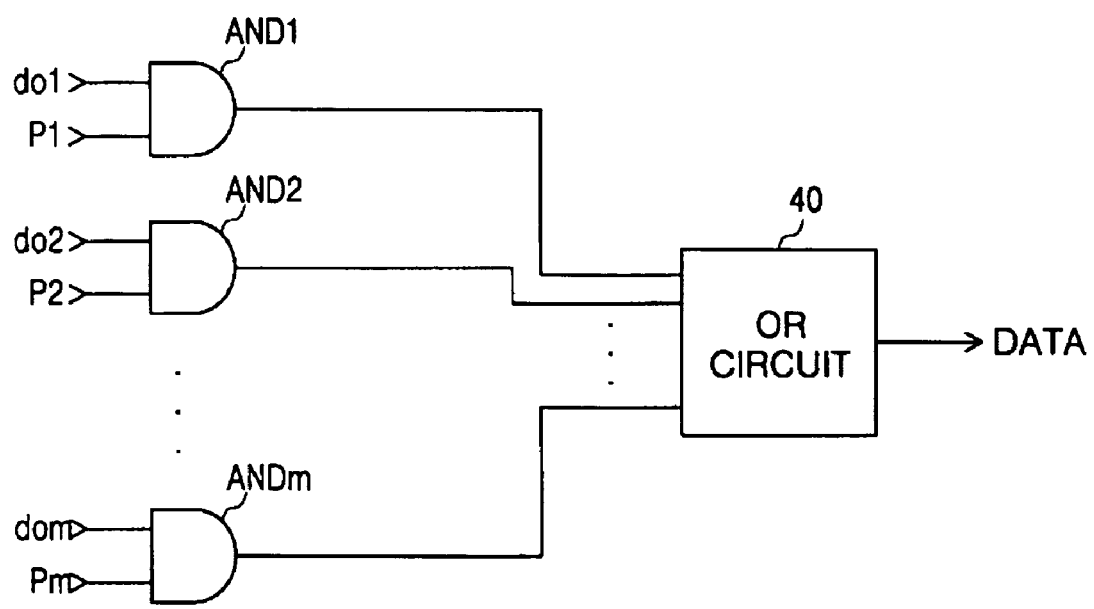
FIG. 7 illustrates a parallel-to-serial converter in accordance with an example embodiment of the present invention.

FIG. 7 illustrates a parallel-to-serial converter, for example, a parallel-to-serial converter (16-j') in accordance with an example embodiment of the present invention. The parallel-to-serial converter (16-j') may include a plurality of AND circuits AND1~ANDm and an OR circuit 40. M bits of data (dol~dom) may be output sequentially through the plurality of AND circuits AND1~ANDm in response to the rising edge of one or more control signals (P1~P(m)). The OR circuit 40 may be used to successively output data DATA without a gap.

Figure 8:
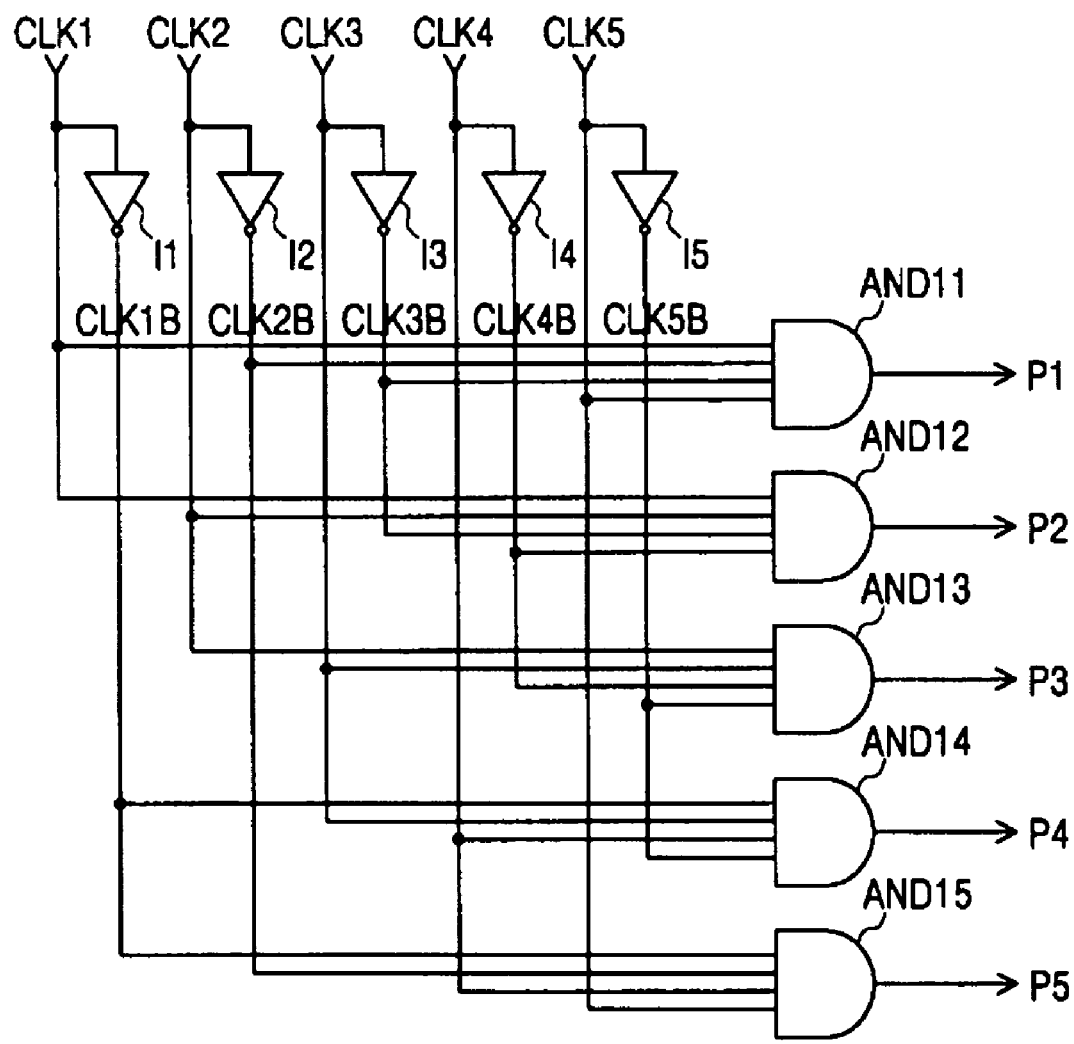
FIG. 8 illustrates a control signal generation circuit in accordance with an example embodiment of the present invention.
Figure 9A:
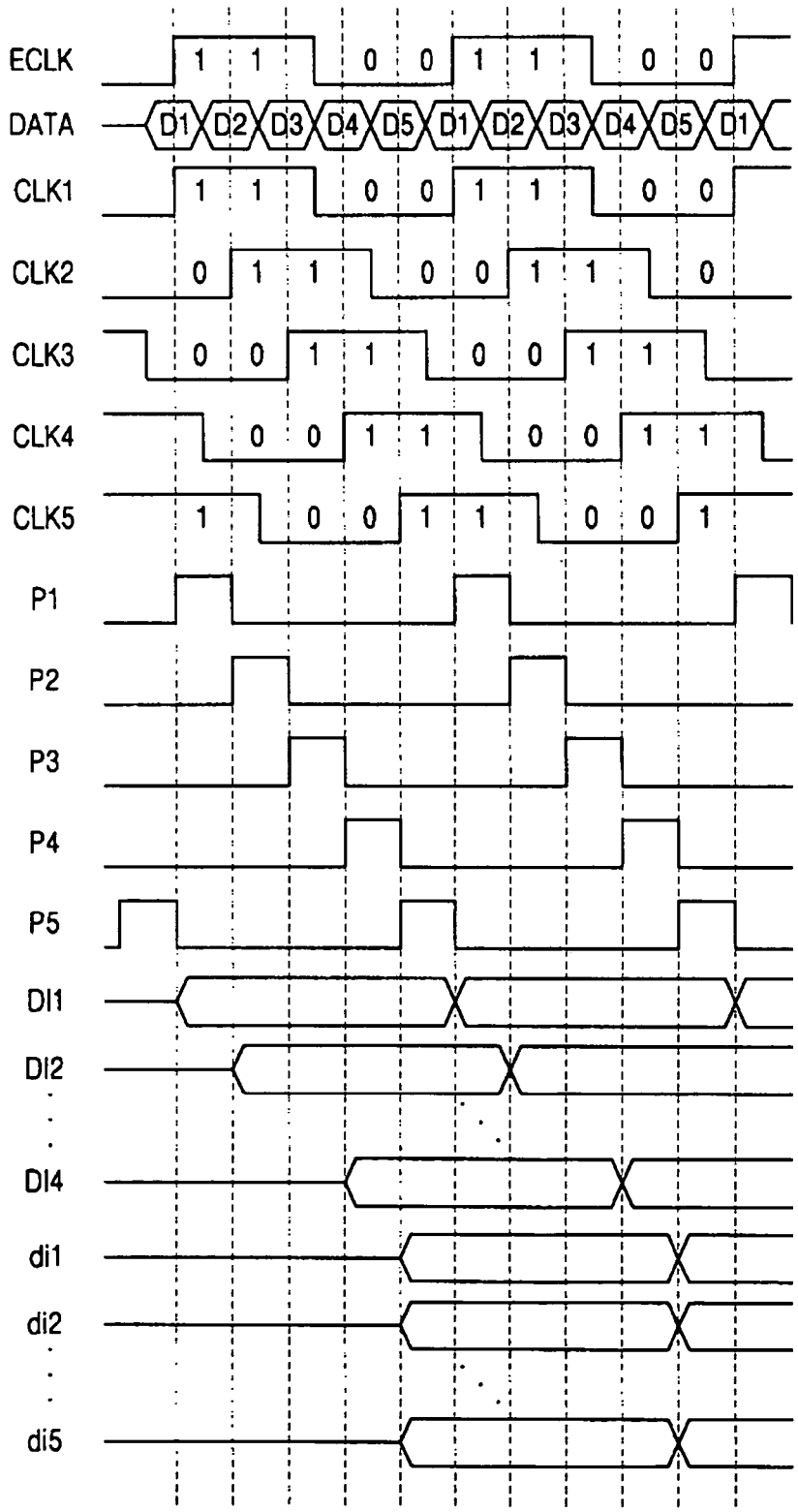
FIG. 9A illustrates a write operation of a memory device utilizing a control signal generation circuit in accordance with an example embodiment of the present invention.
Figure 9B:
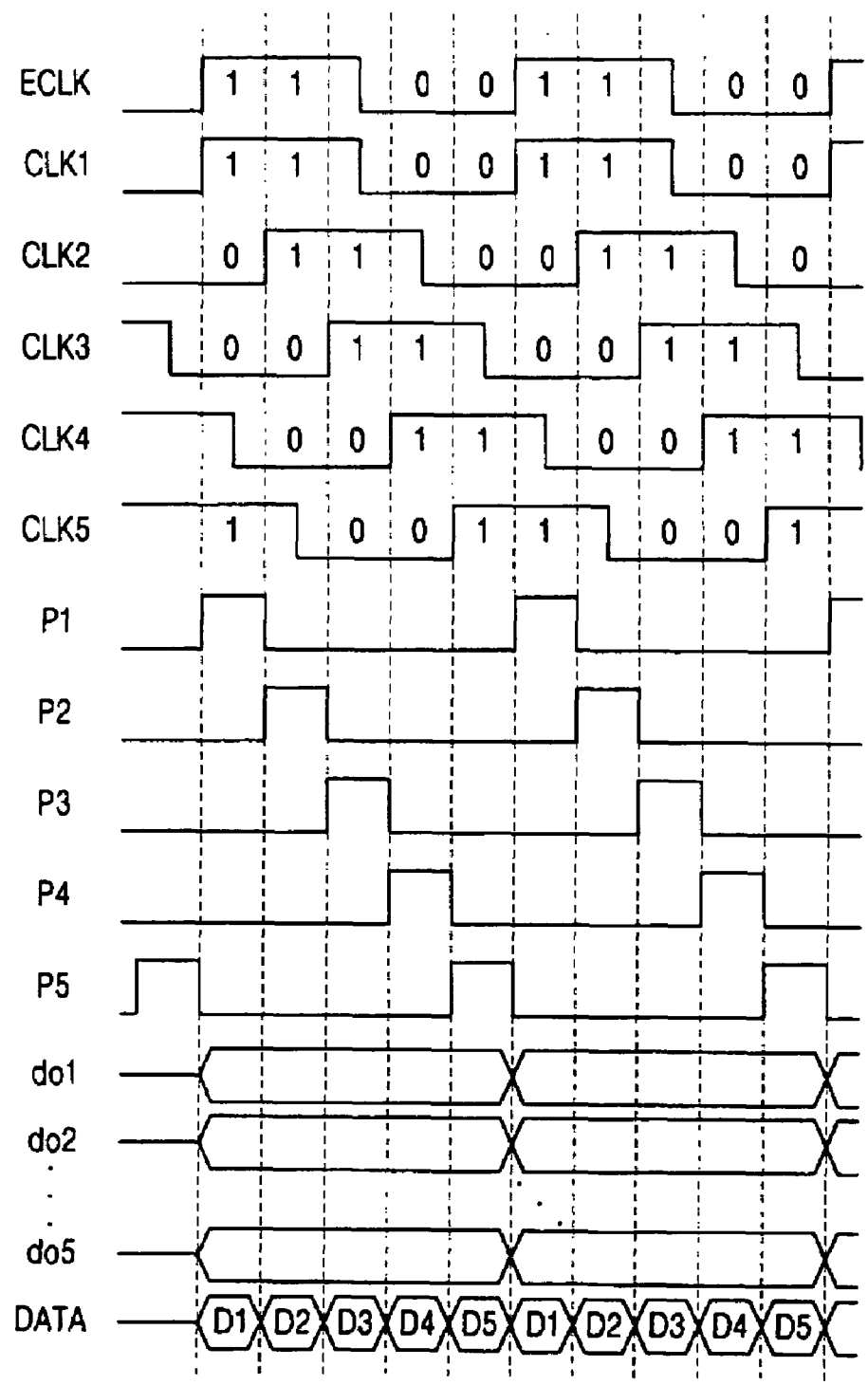
FIG. 9B illustrates a read operation of a memory device utilizing a control signal generation circuit in accordance with an example embodiment of the present invention.

FIG. 8 illustrates a control signal generation circuit, for example, a control signal generation circuit (CSG Ckt.) 26', in accordance with an example embodiment of the present invention. The control signal generation circuit (CSG Ckt.) 26' may include I internal clock signals (where I is an integer; in FIG. 8, I=5), a plurality of inverter circuits Il~Ix (where x is an integer; in FIG. 8, x=5), and a plurality of AND circuits AND11~AND1m (where m is an integer; in FIG. 8, m =5). FIGS. 9A and 9B illustrate example write and read timing diagrams, respectively, for a control signal generation circuit, for example, a control signal generation circuit (CSG Ckt.) 26', in accordance with an example embodiment of the present invention. Example operation of the control signal generation circuit (CSG Ckt.) 26' is described below in conjunction with FIGS. 8, 9A, and 9B.

FIG. 9A illustrates a write operation of a memory device utilizing a control signal generation circuit in accordance with an example embodiment of the present invention. In the example of FIG. 9A, m=l=5 for a write cycle. FIG. 9B illustrates a read operation of a memory device utilizing a control signal generation circuit in accordance with an example embodiment of the present invention. In the example of FIG. 9B, m=l=5 for a read cycle.

As shown, in FIGS. 9A and 9B, control signal P1 is activated when CLK1, CLK2B (the inverse of CLK2), CLK3B (the inverse of CLK3) and CLK5 are at a high level. Control signal P2 is activated when CLK1, CLK2, CLK3B, and CLK4B are at a high level. Control signal P3 is activated when CLK2, CLK3, CLK4B, and CLK5B are at a high level. Control signal P4 is activated when CLK1B, CLK3, CLK4, and CLK5B are at a high level. Control signal P5 is activated when CLK1B, CLK2B, CLK4, and CLK5 are at a high level.

As shown in FIG. 9A, a clock generator, for example, clock generator (CLK Gen.) 24' of FIG. 5 may generate five (l=5) internal clock signals CLKL~CLK5 which have the same frequency as the external clock signal ECLK. The five internal clock signals CLK1~CLK5 may be activated sequentially within one clock cycle of ECLK. A phase difference between adjacent internal clock signals CLKL~CLK5 may be 72°. The data write process from DI1~DI4 to di1~di5 was described above in conjunction with FIG. 6.

A control signal generation circuit, for example, control signal generation circuit (CSG Ckt.) 26' may generate five (m=5) control signals P1~P5 to write five data D1 to D5 to a memory device during one clock cycle of the external clock ECLK. In an example embodiment, m=I=$2^n$+k, where n=2 and k=1.

As shown in FIG. 9B, a clock generator, for example, clock generator (CLK Gen.) 24' of FIG. 5 may generate five (l=5) internal clocks CLK1~CLK5 which have the same frequency as the external clock signal ECLK. The five internal clocks CLK1~CLK5 may be activated sequentially within one clock of ECLK. A phase difference between adjacent internal clocks CLK1~CLK5 may be 72°. The data transfer process from do1 to do5 was described above in conjunction with FIG. 7.

A control signal generation circuit, for example, control signal generation circuit (CSG Ckt.) 26' may generate five (m=5) control signals P1~P5 to read five data D1 to D5 from a memory device during one clock cycle of the external clock ECLK. In an example embodiment, m=I=$2^n$+k, where n=2 and k=1.

Figure 10:
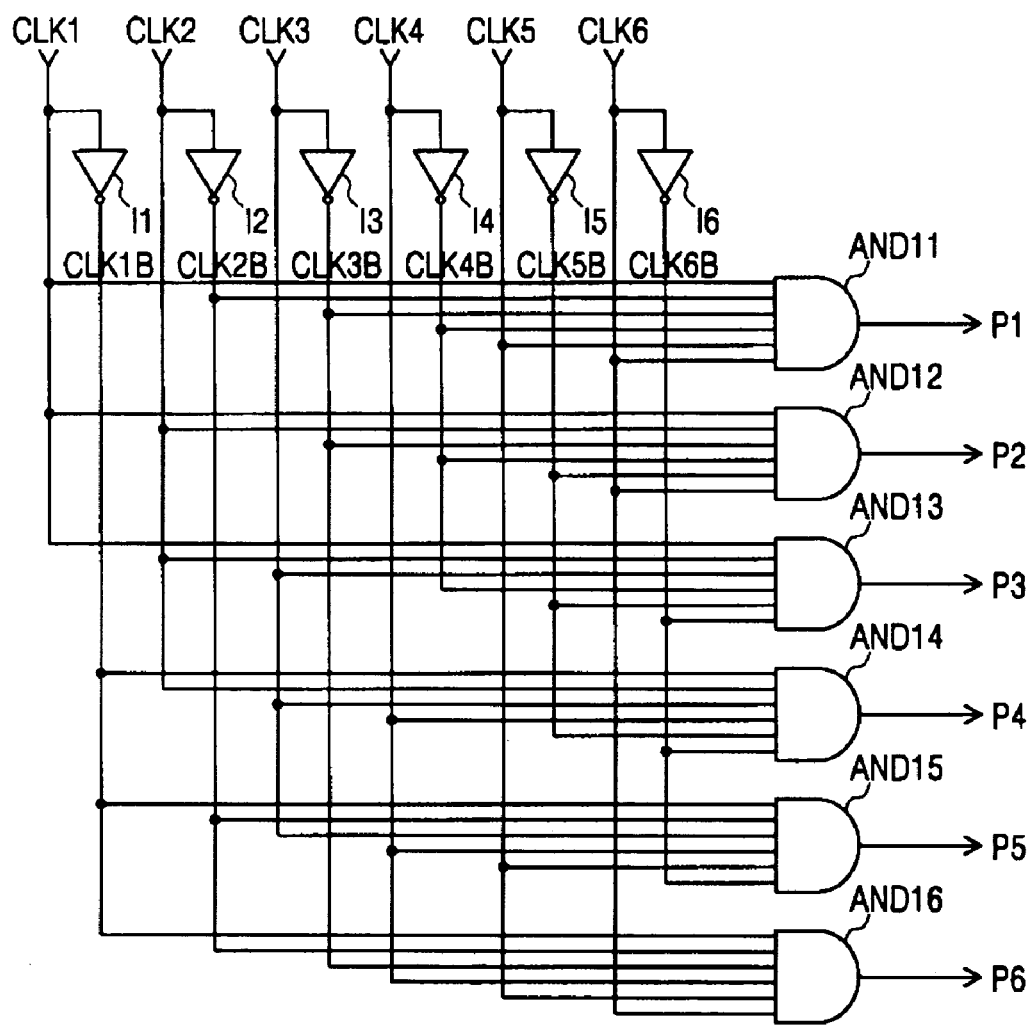
FIG. 10 illustrates a control signal generation circuit in accordance with another example embodiment of the present invention.
Figure 11A:
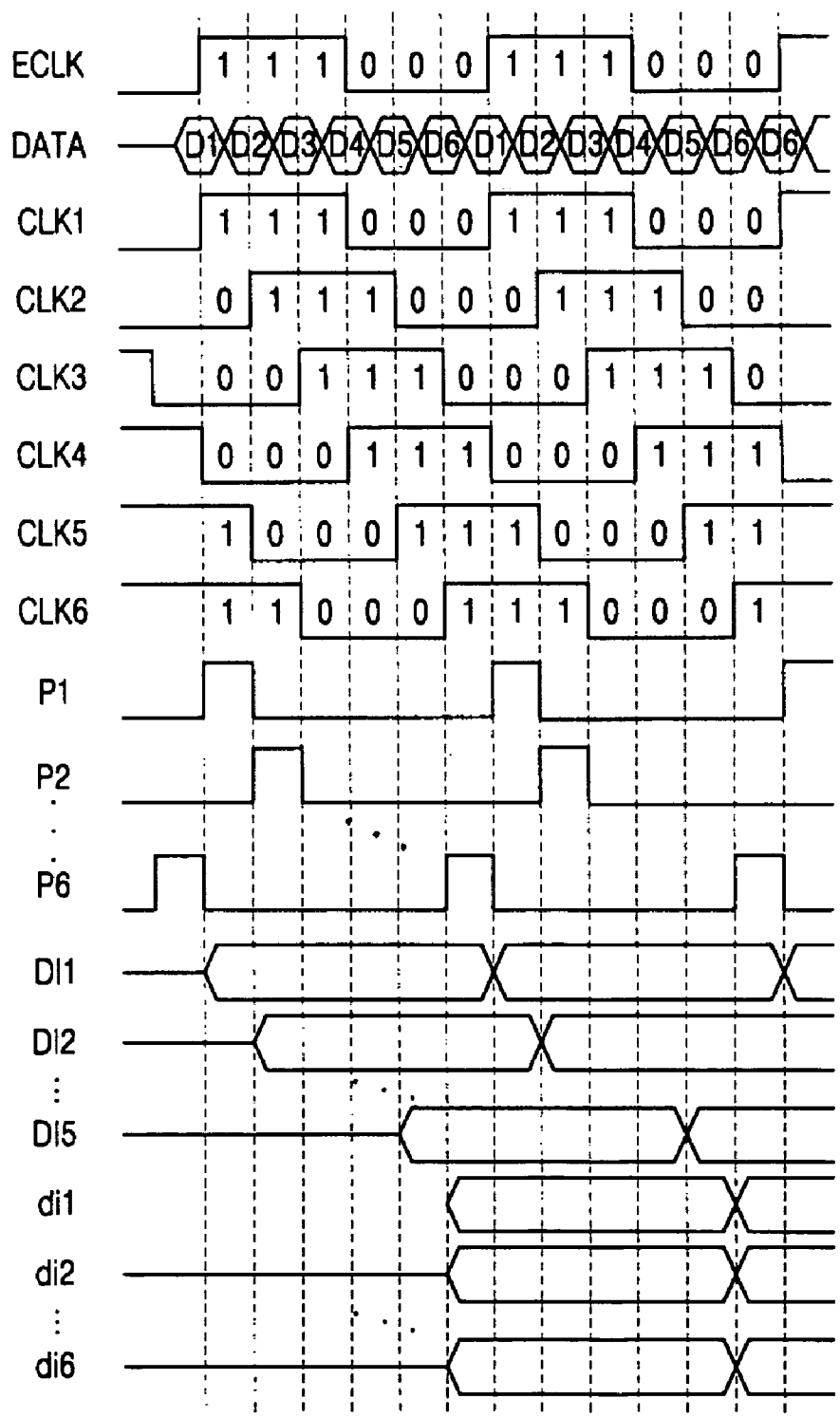
FIG. 11A illustrates a write operation of a memory device utilizing a control signal generation circuit in accordance with another example embodiment of the present invention.
Figure 11B:
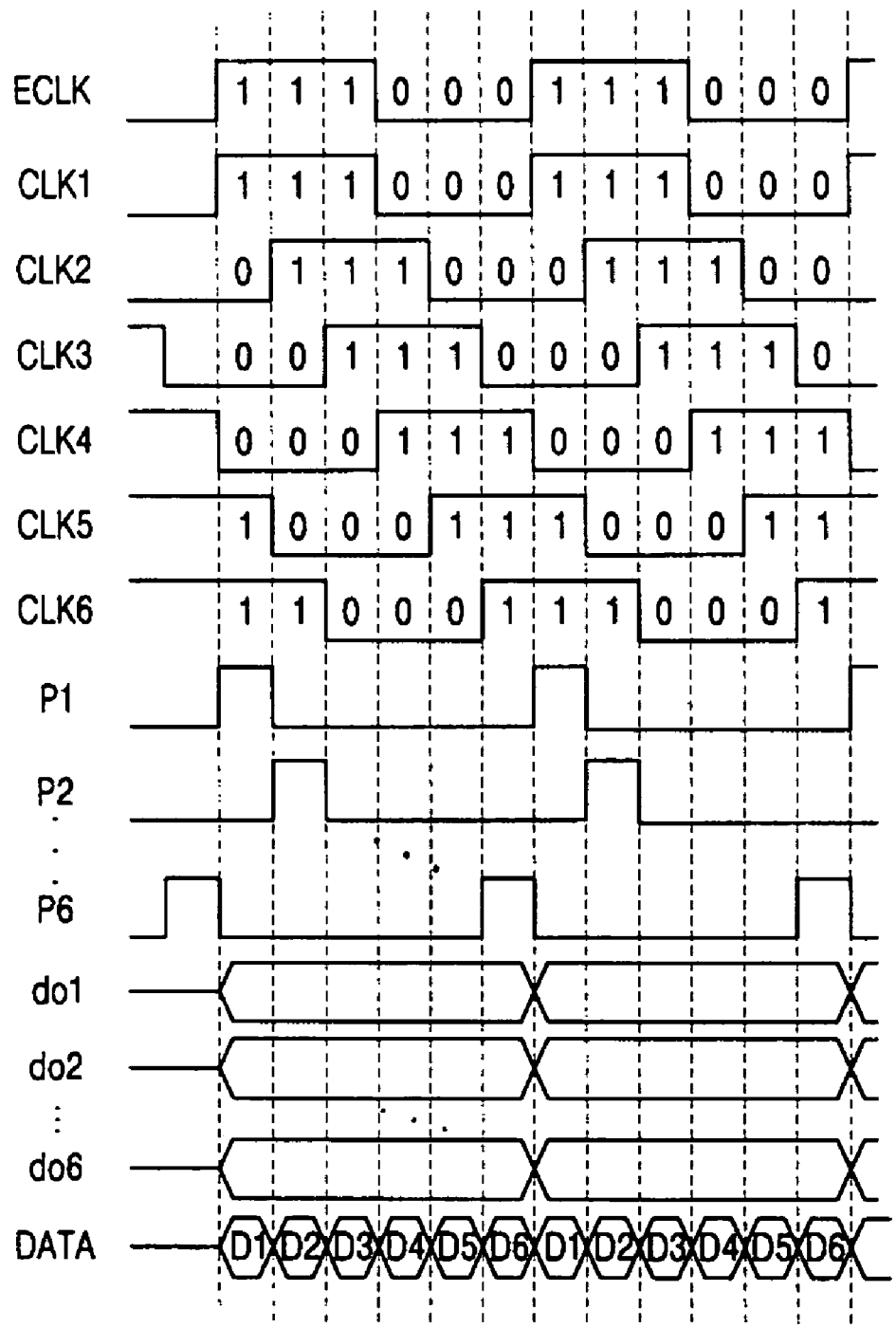
FIG. 11B illustrates a read operation of a memory device utilizing a control signal generation circuit in accordance with another example embodiment of the present invention.

FIG. 10 illustrates a control signal generation circuit, for example, a control signal generation circuit (CSG Ckt.) 26', in accordance with an example embodiment of the present invention. The control signal generation circuit (CSG Ckt.) 26' may include I internal clock signals (where I is an integer; in FIG. 10, I=6), a plurality of inverter circuits I1~Ix (where x is an integer; in FIG. 10, x=6), and a plurality of AND circuits ANDL11~AND1m (where m is an integer; in FIG. 10, m =6). FIGS. 11A and 11B illustrate example write and read timing diagrams, respectively, for a control signal generation circuit, for example, a control signal generation circuit (CSG Ckt.) 26', in accordance with an example embodiment of the present invention. Example operation of the control signal generation circuit (CSG Ckt.) 26' is described below in conjunction with FIGS. 10, 11A, and 11B.

FIG. 11A illustrates a write operation of a memory device utilizing a control signal generation circuit in accordance with another example embodiment of the present invention. In the example of FIG. 11A, m=l=6 for a write cycle. FIG. 11B illustrates a read operation of a memory device utilizing a control signal generation circuit in accordance with another example embodiment of the present invention. In the example of FIG. 11B, m=l=6 for a read cycle.

As shown, in FIGS. 11A and 11B, control signal P1 is activated when CLK1, CLK2B (the inverse of CLK2), CLK3B (the inverse of CLK3), CLK4B (the inverse of CLK4), CLK5 and CLK6 are at a high level. Control signal P2 is activated when CLK1, CLK2, CLK3B, CLK4B, CLK5B, and CLK6 are at a high level. Control signal P3 is activated when CLK1, CLK2, CLK3, CLK4B, CLK5B, and CLK6B are at a high level. Control signal P4 is activated when CLK1B, CLK2, CLK3, CLK4, CLK5B, and CLK6B are at a high level. Control signal P5 is activated when CLK1B, CLK2B, CLK3, CLK4, CLK5, and CLK6B are at a high level. Control signal P6 is activated when CLK1B, CLK3B, CLK4, CLK5, and CLK6 are at a high level.

As shown in FIG. 11A, a clock generator, for example, clock generator (CLK Gen.) 24' of FIG. 5 may generate six (I=6) internal clock signals CLK 1~CLK6 which have the same frequency as the external clock signal ECLK. The six internal clock signals CLK1~CLK6 may be activated sequentially within one clock cycle of ECLK. A phase difference between adjacent internal clock signals CLKL~CLK6 may be 60°. The data write process from DI1~DI5 to di1~di6 was described above in conjunction with FIG. 6.

A control signal generation circuit, for example, control signal generation circuit (CSG Ckt.) 26' may generate six (m=6) control signals P1~P6 to write six data D1 to D6 to a memory device during one clock cycle of the external clock ECLK. In an example embodiment, m=I=$2^n$+k, where n=2 and k=2.

As shown in FIG. 11B, a clock generator, for example, clock generator (CLK Gen.) 24' of FIG. 5 may generate six (I=6) internal clock signals CLK1 ~CLK6 which have the same frequency as the external clock signal ECLK. The six internal clock signals CLKL~CLK6 may be activated sequentially within one clock cycle of ECLK. A phase difference between adjacent internal clock signals CLK1~CLK6 may be 60°. The data transfer process from do1 to do6 was described above in conjunction with FIG. 7.

A control signal generation circuit, for example, control signal generation circuit (CSG Ckt.) 26' may generate six (m=6) control signals P1~P6 to read six data D1 to D6 from a memory device during one clock cycle of the external clock ECLK. In an example embodiment, m=I=$2^n$+k, where n=2 and k=2

Figure 12:
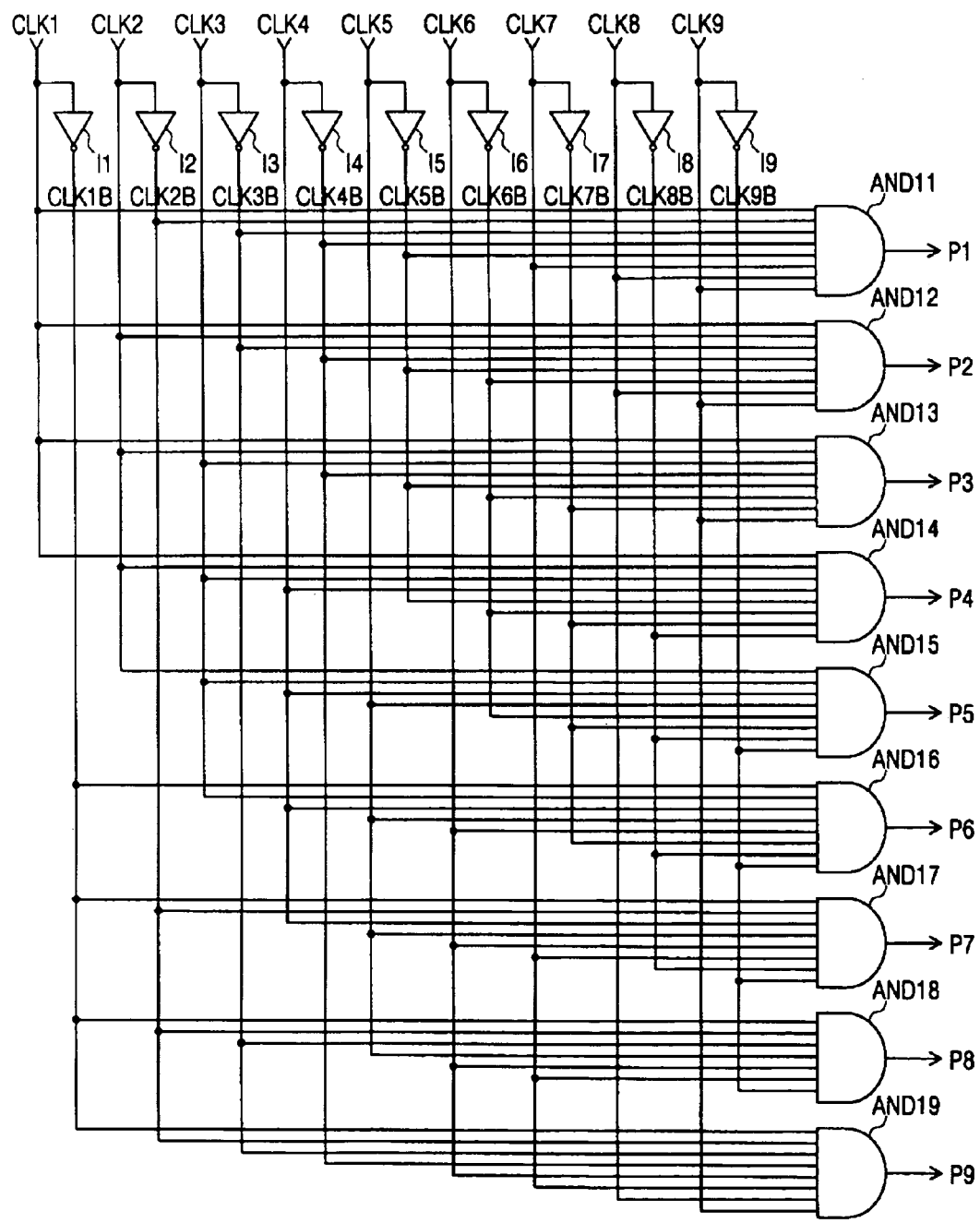
FIG. 12 illustrates a control signal generation circuit in accordance with another example embodiment of the present invention.
Figure 13A:
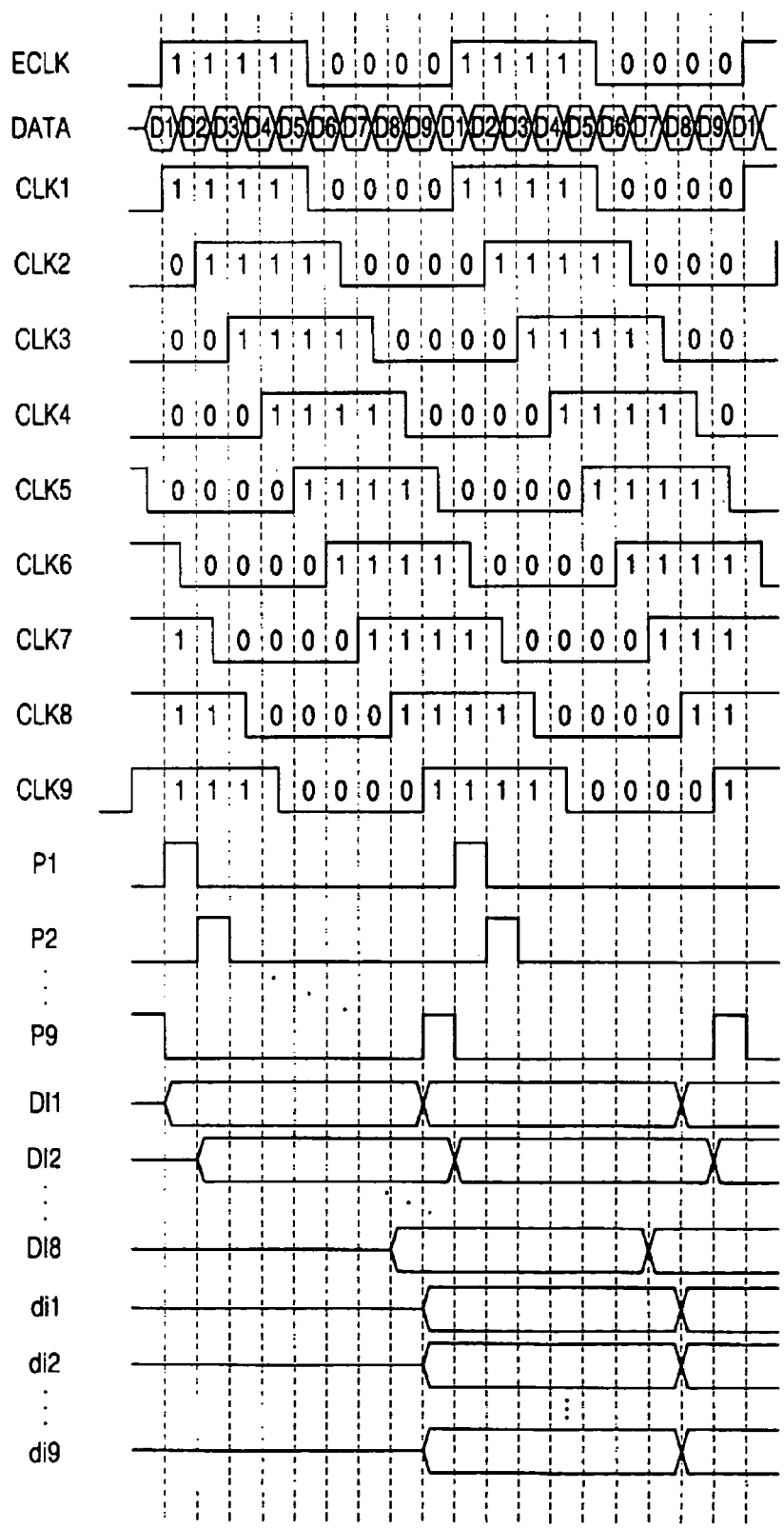
FIG. 13A illustrates a write operation of a memory device utilizing a control signal generation circuit in accordance with another example embodiment of the present invention.
Figure 13B:
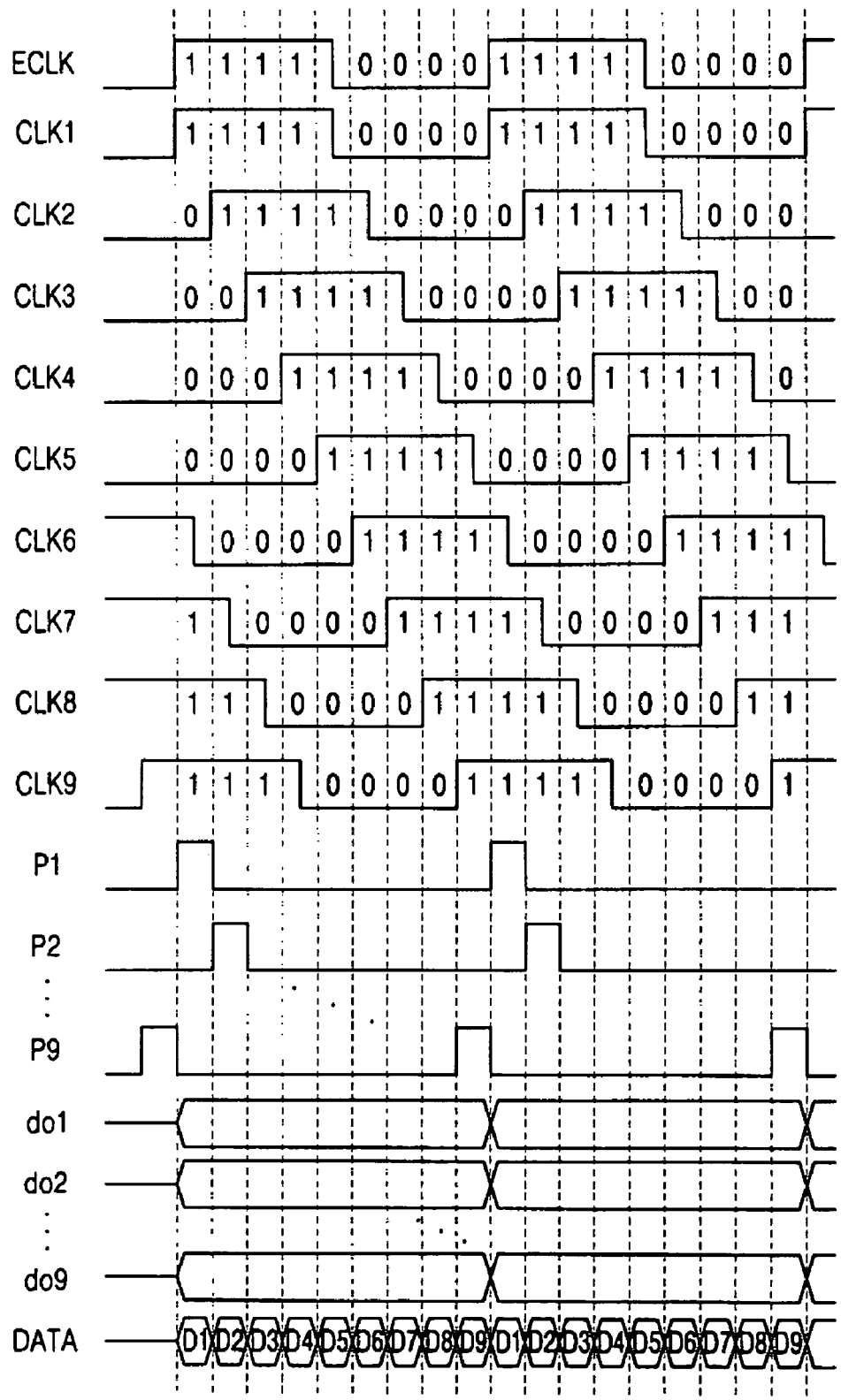
FIG. 13B illustrates a read operation of a memory device utilizing a control signal generation circuit in accordance with another example embodiment of the present invention.

FIG. 12 illustrates a control signal generation circuit, for example, a control signal generation circuit (CSG Ckt.) 26', in accordance with an example embodiment of the present invention. The control signal generation circuit (CSG Ckt.) 26' may include I internal clock signals (where I is an integer; in FIG. 12, I=9), a plurality of inverter circuits I1~Ix (where x is an integer; in FIG. 12, x=9). and a plurality of AND circuits AND11~AND1m (where m is an integer; in FIG. 12, m =9). FIGS. 13A and 13B illustrate example write and read timing diagrams, respectively, for a control signal generation circuit, for example, a control signal generation circuit (CSG Ckt.) 26', in accordance with an example embodiment of the present invention. Example operation of the control signal generation circuit (CSG Ckt.) 26' is described below in conjunction with FIGS. 12, 13A, and 13B.

FIG. 13A illustrates a write operation of a memory device utilizing a control signal generation circuit in accordance with another example embodiment of the present invention. In the example of FIG. 13A, m=l=9 for a write cycle. FIG. 13B illustrates a read operation of a memory device utilizing a control signal generation circuit in accordance with another example embodiment of the present invention. In the example of FIG. 13B, m=l=9 for a read cycle.

As shown, in FIGS. 13A and 13B, control signal P1 is activated when CLK1, CLK2B (the inverse of CLK2), CLK3B (the inverse of CLK3), CLK4B (the inverse of CLK4), CLK5B (the inverse of CLK5), CLK6B (the inverse of CLK6), CLK7, CLK8, and CLK9 are at a high level. Control signal P2 is activated when CLK1, CLK2, CLK3B, CLK4B, CLK5B, CLK6B, CLK7B, CLK8, and CLK9 are at a high level. Control signal P3 is activated when CLK1, CLK2, CLK3, CLK4B, CLK5B, CLK6B, CLK7B, CLK8B, and CLK9 are at a high level. Control signal P4 is activated when CLK1, CLK2, CLK3, CLK4, CLK5B, CLK6B, CLK7B, CLK8B, and CLK9B are at a high level. Control signal P5 is activated when CLK1B, CLK2, CLK3, CLK4, CLK5, CLK6B, CLK7B, CLK8B, and CLK9B are at a high level. Control signal P6 is activated when CLK1B, CLK2B, CLK3, CLK4, CLK5, CLK6, CLK7B, CLK8B, and CLK9B are at a high level. Control signal P7 is activated when CLK1B, CLK2B, CLK3B, CLK4, CLK5, CLK6, CLK7, CLK8B, and CLK9B are at a high level. Control signal P8 is activated when CLK1B, CLK2B, CLK3B, CLK4B, CLK5, CLK6, CLK7, CLK8, and CLK9B are at a high level. Control signal P9 is activated when CLK1B, CLK2B, CLK3B, CLK4B, CLK5B, CLK6, CLK7, CLK8, and CLK9 are at a high level.

As shown in FIG. 13A, a clock generator, for example, clock generator (CLK Gen.) 24' of FIG. 5 may generate nine (I=9) internal clock signals CLK1~CLK9 which have the same frequency as the external clock signal ECLK. The nine internal clock signals CLK1~CLK9 may be activated sequentially within one clock cycle of ECLK. A phase difference between adjacent internal clock signals CLK1~CLK9 may be 40°. The data write process from DI1~DI8 to di1~di9 was described above in conjunction with FIG. 6.

A control signal generation circuit, for example, control signal generation circuit (CSG Ckt.) 26' may generate nine (m=9) control signals P1~P9 to write nine data D1 to D9 to a memory device during one clock cycle of the external clock ECLK. In an example embodiment, m=I=2$^n$+k, where n=3 and k=1.

As shown in FIG. 13B, a clock generator, for example, clock generator (CLK Gen.) 24' of FIG. 5 may generate nine (I=9) internal clocks CLK1~CLK9 which have the same frequency as the external clock signal ECLK. The nine internal clocks CLK1~CLK9 may be activated sequentially within one clock of ECLK. A phase difference between adjacent internal clocks CLK1~CLK9 may be 40°. The data transfer process from do1 to do9 was described above in conjunction with FIG. 7.

A control signal generation circuit, for example, control signal generation circuit (CSG Ckt.) 26' may generate nine (m=9) control signals P1~P9 to read nine data D1 to D9 from a memory device during one clock cycle of the external clock ECLK. In an example embodiment, m=I=2$^n$+k, where n=3 and k=1.

Figure 14:
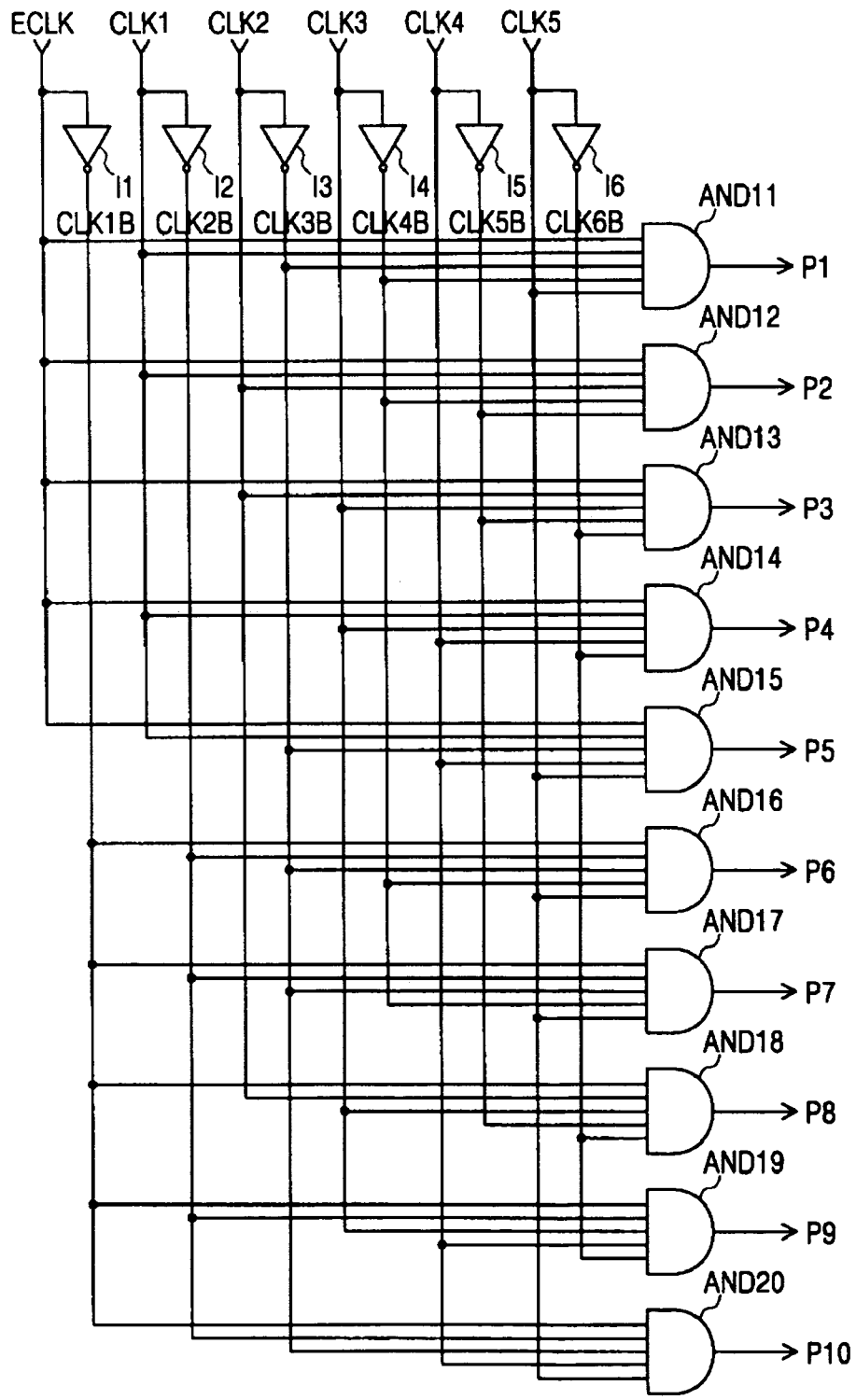
FIG. 14 illustrates a control signal generation circuit in accordance with another example embodiment of the present invention.
Figure 15A:
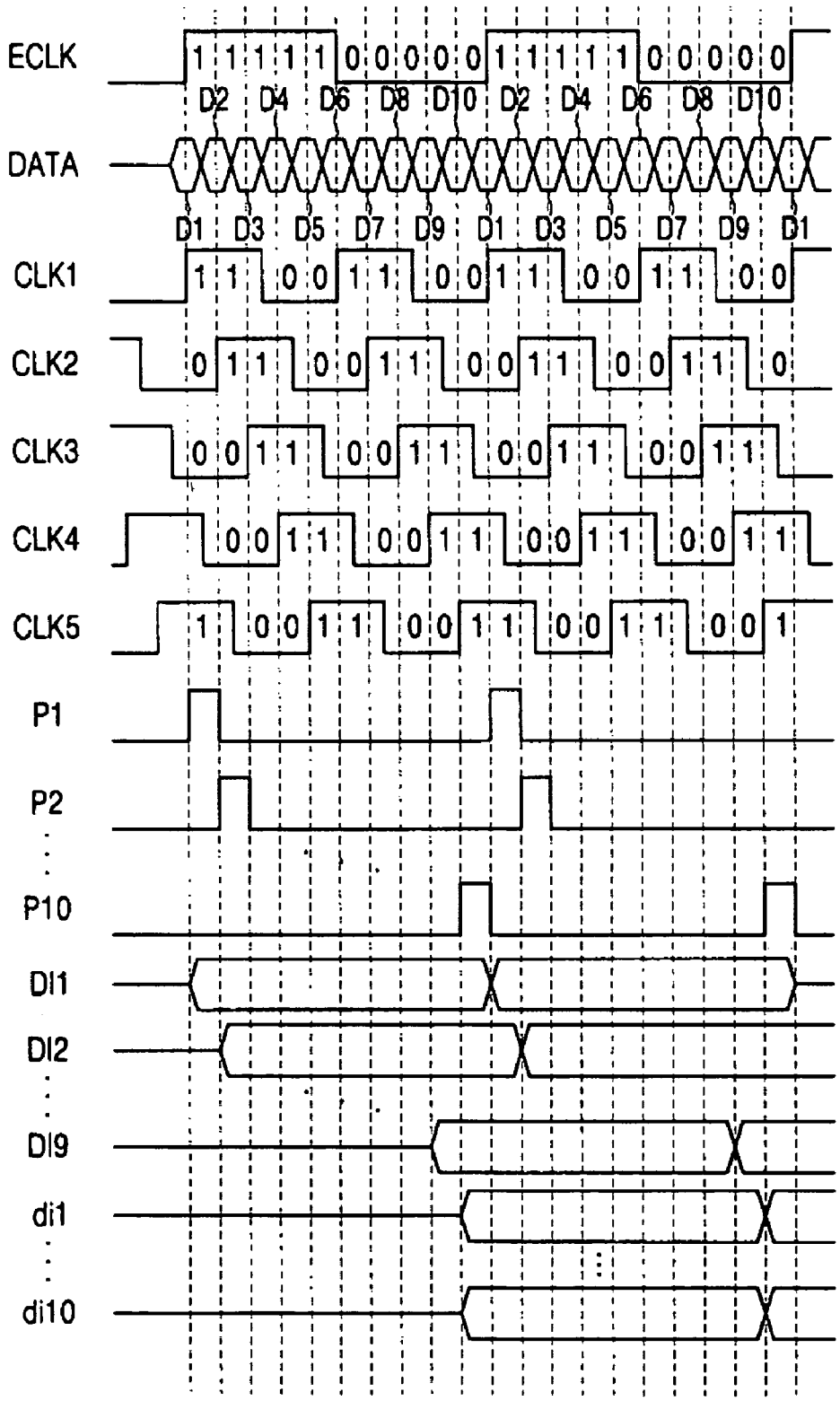
FIG. 15A illustrates a write operation of a memory device utilizing a control signal generation circuit in accordance with another example embodiment of the present invention.
Figure 15B:
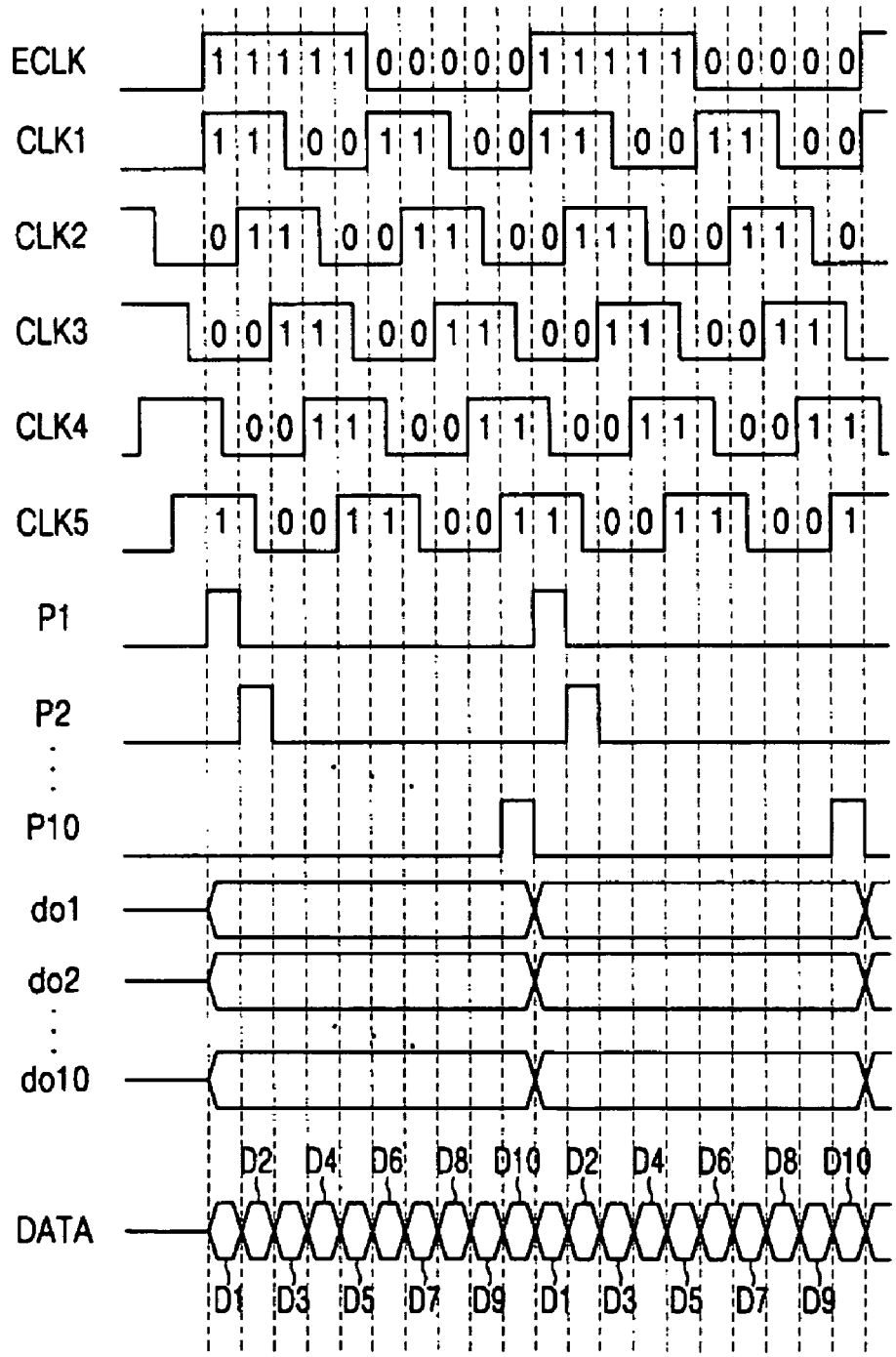
FIG. 15B illustrates a read operation of a memory device utilizing a control signal generation circuit in accordance with another example embodiment of the present invention.

FIG. 14 illustrates a control signal generation circuit, for example, a control signal generation circuit (CSG Ckt.) 26', in accordance with an example embodiment of the present invention. The control signal generation circuit (CSG Ckt.) 26' may include I internal clock signals (where I is an integer; in FIG. 14, I =5), a plurality of inverter circuits I1~Ix (where x is an integer; in FIG. 14, x =6), and a plurality of AND circuits AND11~AND1m (where m is an integer; in FIG. 14, m=10, and corresponds to AND2O). FIGS. 15A and 15B illustrate example write and read timing diagrams, respectively, for a control signal generation circuit, for example, a control signal generation circuit (CSG Ckt.) 26', in accordance with an example embodiment of the present invention. Example operation of the control signal generation circuit (CSG Ckt.) 26' is described below in conjunction with FIGS. 14, 15A, and 15B.

FIG. 15A illustrates a write operation of a memory device utilizing a control signal generation circuit in accordance with another example embodiment of the present invention. In the example of FIG. 13A, m=2l=10 for a write cycle. FIG. 15B illustrates a read operation of a memory device utilizing a control signal generation circuit in accordance with another example embodiment of the present invention. In the example of FIG. 13B, m=2l=10 for a read cycle.

As shown, in FIGS. 15A and 15B, control signals P1 and P6 are activated when CLK1, CLK2B (the inverse of CLK2), CLK3B (the inverse of CLK3), CLK4B (the inverse of CLK4), and CLK5 are at a high level. Control signals P2 and P7 are activated when CLK1, CLK2, CLK3B, CLK4B, and CLK5B are at a high level. Control signals P3 and P8 are activated when CLK1B, CLK2, CLK3, CLK4B, and CLK5B are at a high level. Control signal P4 and P9 are activated when CLK1B, CLK2B, CLK3, CLK4, and CLK5B are at a high level. Control signals P5 and P10 are activated when CLK1B, CLK2B, CLK3B, CLK4, and CLK5 are at a high level.

As shown in FIG. 15A, a clock generator, for example, clock generator (CLK Gen.) 24' of FIG. 5 may generate five (I=5) internal clock signals CLK1~CLK5 which have twice the frequency as the external clock signal ECLK. The five internal clock signals CLKL1~CLK5 may be activated more than once (for example, twice) sequentially within one clock cycle of ECLK. A phase difference between adjacent internal clock signals CLK1~CLK5 may be 72°. The data write process from DI1~DI9 to di1~di10 was described above in conjunction with FIG. 6.

A control signal generation circuit, for example, control signal generation circuit (CSG Ckt.) 26' may generate ten (m=2I) control signals P1~P10 to write ten data D1 to D10 to a memory device during one clock cycle of the external clock ECLK. In an example embodiment, m=2I=2$^n$+k, where n=3 and k=2.

As shown in FIG. 15B, a clock generator, for example, clock generator (CLK Gen.) 24' of FIG. 5 may generate five (I=5) internal clock signals CLK1~CLK5 which have twice the frequency as the external clock signal ECLK. The five internal clock signals CLK1~CLK5 may be activated sequentially within one clock cycle of ECLK. A phase difference between adjacent internal clock signals CLK1~CLK5 may be 72°. The data transfer process from do1 to do10 was described above in conjunction with FIG. 7.

A control signal generation circuit, for example, control signal generation circuit (CSG Ckt.) 26' may generate ten (m=2I) control signals P1~P10 to read ten data D1 to D10 from a memory device during one clock cycle of the external clock ECLK. In an example embodiment, m=2I=2$^n$k, where n=3 and k =2.

Figure 16:
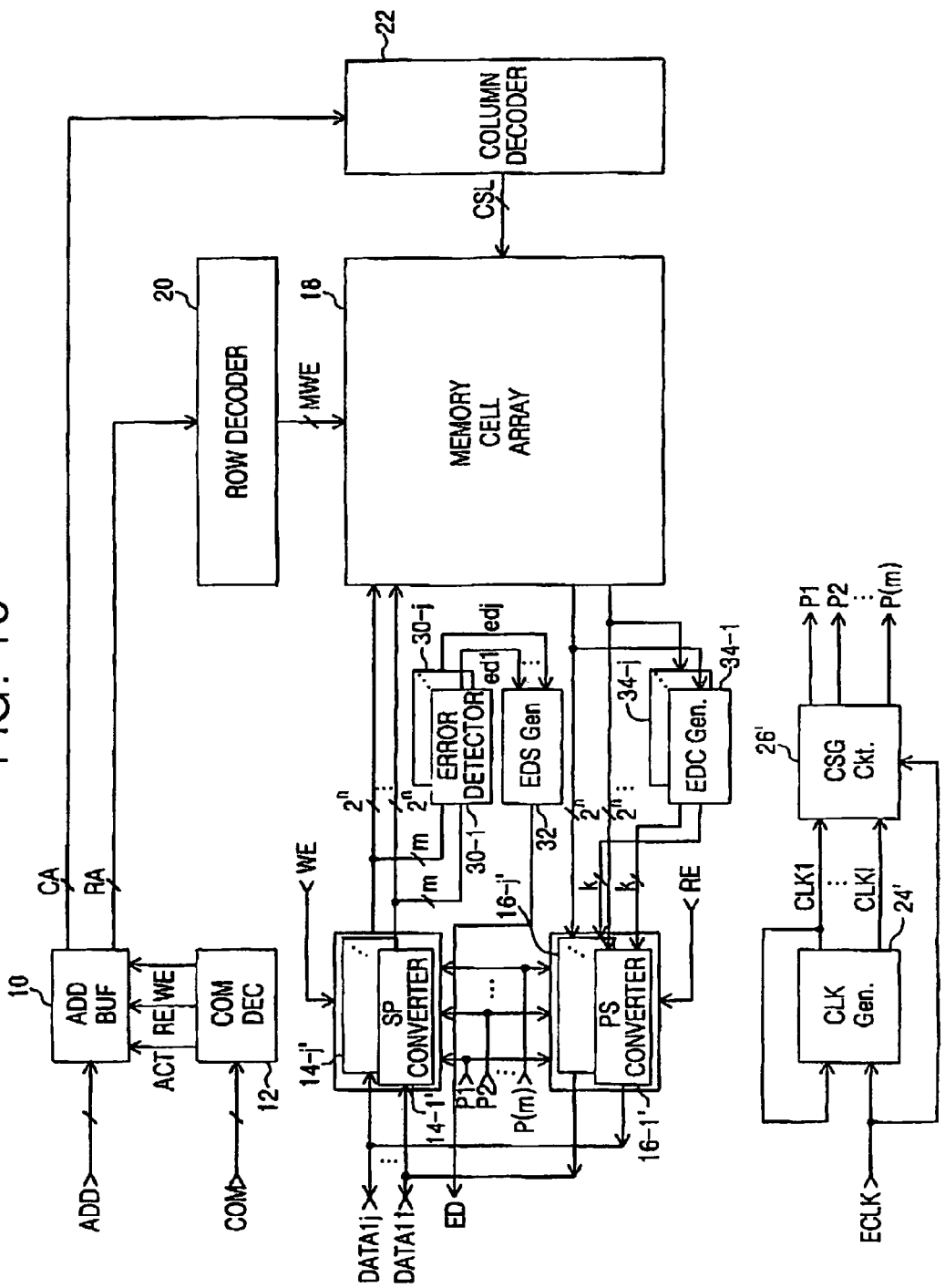
FIG. 16 illustrates a memory device in accordance with another example embodiment of the present invention.

FIG. 16 illustrates a memory device, including associated control logic, in accordance with another example embodiment of the present invention. As shown and as discussed above in conjunction with FIG. 5, the associated control logic may include one or more serial-to-parallel converters 14-1' to 14-j', one or more parallel-to-serial converters 16-1' to 16-j', a memory cell array 18, a clock generator (CLK Gen.) 24', and/or a control signal generation circuit (CSG Ckt.) 26'. The associated control logic may also include the conventional address buffer (ADD BUF) 10, command decoder (COM DEC) 12, a memory cell array 18, row decoder 20, and/or column decoder 22 of FIG. 1B.

Each serial-to-parallel converter (14-1' to 14-j') may receive serial data DATA composed of m bit data and output m bit parallel data through m data bus lines, in response to a write command signal (WE) and a plurality of control signals (P1~P(m)). In addition, each of the serial-to-parallel converters (14-1' to 14-j') may be coupled to the memory cell array 18 via $2^n$ data bus lines.

Each parallel-to-serial converter (16-1' to 16-j') may receive $2^n$ bit data from the memory cell array 18 in parallel and output m bit serial data responsive to a read command signal (RE) and the plurality of control signals (P1~P(m)).

The clock generator (CLK Gen.) 24' may receive the external clock signal ECLK and perform a locking operation to output an internal clock signal CLK1, which is locked with ECLK. After completing the locking operation, the clock generator (CLK Gen.) 24' may output a plurality of internal clock signals (CLK1~CLK1) to the control signal generation circuit (CSG Ckt.) 26'. The control signal generation circuit (CSG Ckt.) 26' may generate the plurality of control signals (P1~P(m)).

As shown in FIG. 16, the control signal generation circuit (CSG Ckt.) 26' generates a plurality of control signals (P1~P(m)). In an example embodiment, $m=2^n+k$. As a result, in an example embodiment of the present invention, one or more serial-to-parallel converters (14-1' to 14-j') and/or one or more parallel-to-serial converters (16-1' to 16-j') may also convert m data bits into a parallel or serial stream during one clock cycle of ECLK, in response to one or more control signals (P1~P(m)). In an example embodiment, the $2^n$ data bits are valid data writable to and readable from a memory cell array and the k data bits are check data, as described below.

As shown in FIG. 16, a memory device including associated control logic in accordance with another example embodiment of the present invention may also include an error detection circuit 35 and/or one or more error detection code generation circuits (34-1 to 34-j). The error detection circuit 35 may further include one or more error detectors (30-1 to 30-j) and/or an error detection signal generating circuit 32.

As shown in FIG. 16, each of one or more error detectors (30-1 to 30-j) receives the m bit data from the one or more serial-to-parallel converters (14-1' to 14-j') through the m data bus lines. Each of the one or more error detectors (30-1 to 30-j) generates an error detection signal ed1 to edj and the error detection signal generating circuit 32 combines the error detection signals ed1 to edj from the one or more error detectors (30-1 to 30-j) and generates a composite error detection signal ED.

As also shown in FIG. 16, each of the one or more error detection code generation circuits (34-1 to 34-j) receives the $2^n$ bit data from the memory cell array 18 through $2^n$ data bus lines. Each of the one or more error detection code generation circuits (34-1 to 34-j) generates k bits, for example, error detection bits, that are forwarded to each of the one or more parallel-to-serial converters (16-1' to 16-j'), where the k error detection bits from the one or more error detection code generation circuits (34-1 to 34-j) are combined with the $2^n$ bit data from the memory cell array 18 and output as a serial data stream DATA11~DATA1j.

As described above, each of one or more error detectors (30-1 to 30-j) may receive m (where $m=2^n+k$) bits of parallel data from each of the one or more serial-to-parallel converters (14-1' to 14-j'), may detect whether an error occurred or not, and may generate an error signal (ed1~edj). The error detection signal generating circuit 32 may receive all error detection signals (ed1~edj), may determine if an error exists or not, and may output a composite error detection signal ED to a memory controller, for example the memory controller 100 of FIG. 1A.

Figure 17:
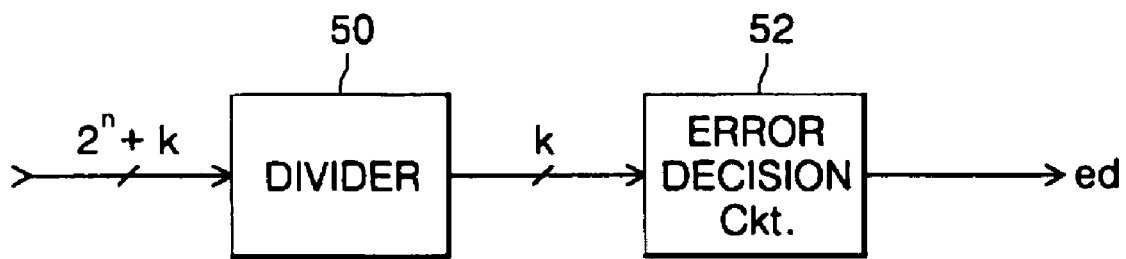
FIG. 17 illustrates an error detector in accordance with an example embodiment of the present invention.

FIG. 17 illustrates an error detector, for example, one of the error detectors (30-1 to 30-j), in accordance with an example embodiment of the present invention. An error detector (30-j) may implement a parity check method or CRC method. If implementing a CRC method, an error detector (30-j) may include a divider 50 and an error decision circuit 52. As shown, the divider 50 may divide the m bits of parallel data into k+1 bits of data and may output k bits. If the k bits are composed of all zeroes, the error decision circuit 52 may determine there is no error. If the k bits are not composed of all zeroes, the error decision circuit 52 may determine there is an error.

Figure 18:
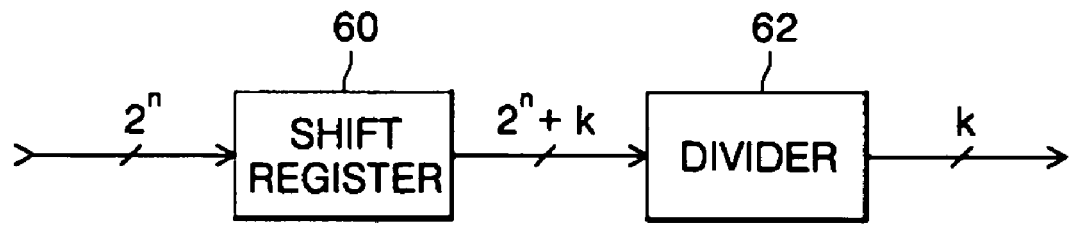
FIG. 18 illustrates an error detection code generation circuit in accordance with an example embodiment of the present invention.

FIG. 18 illustrates an error detection code generation circuit, for example, one or more error detection code generation circuits (34-1 to 34-j), in accordance with an example embodiment of the present invention. An error detection code generation circuit (34-j) may generate a k-bit code corresponding to $2^n$ bits of parallel data output from the memory cell array 18 to each of the parallel-to-serial converters (16-1' to 16-j'). Each of the parallel-to-serial converters (16-1' to 16-j') may convert the $2^n$ bits of parallel data from the memory cell array 18 and the k bits of data from the one or more error detection code generation circuits (34-1 to 34-j) into m (where $m=2^n+k$) bits of serial data, in response to the one or more control signals (P1~P(m)).

An error detection code generation circuit (34-j) may include a shift register 60 and a divider 62. The shift register 60 may shift the $2^n$ bits of data (for example, left) by k bits, so that the least significant bit (LSB) of k bits is zero, to generate $2^n+k$ bits for the divider 62. The divider 62 may divide the m bits of data into k+1 bits of data and output a remainder of k bits. If all of the k bits of the remainder are zero, there is no error. If all of the k bits of the remainder are not zero, there is an error.

Figure 19:
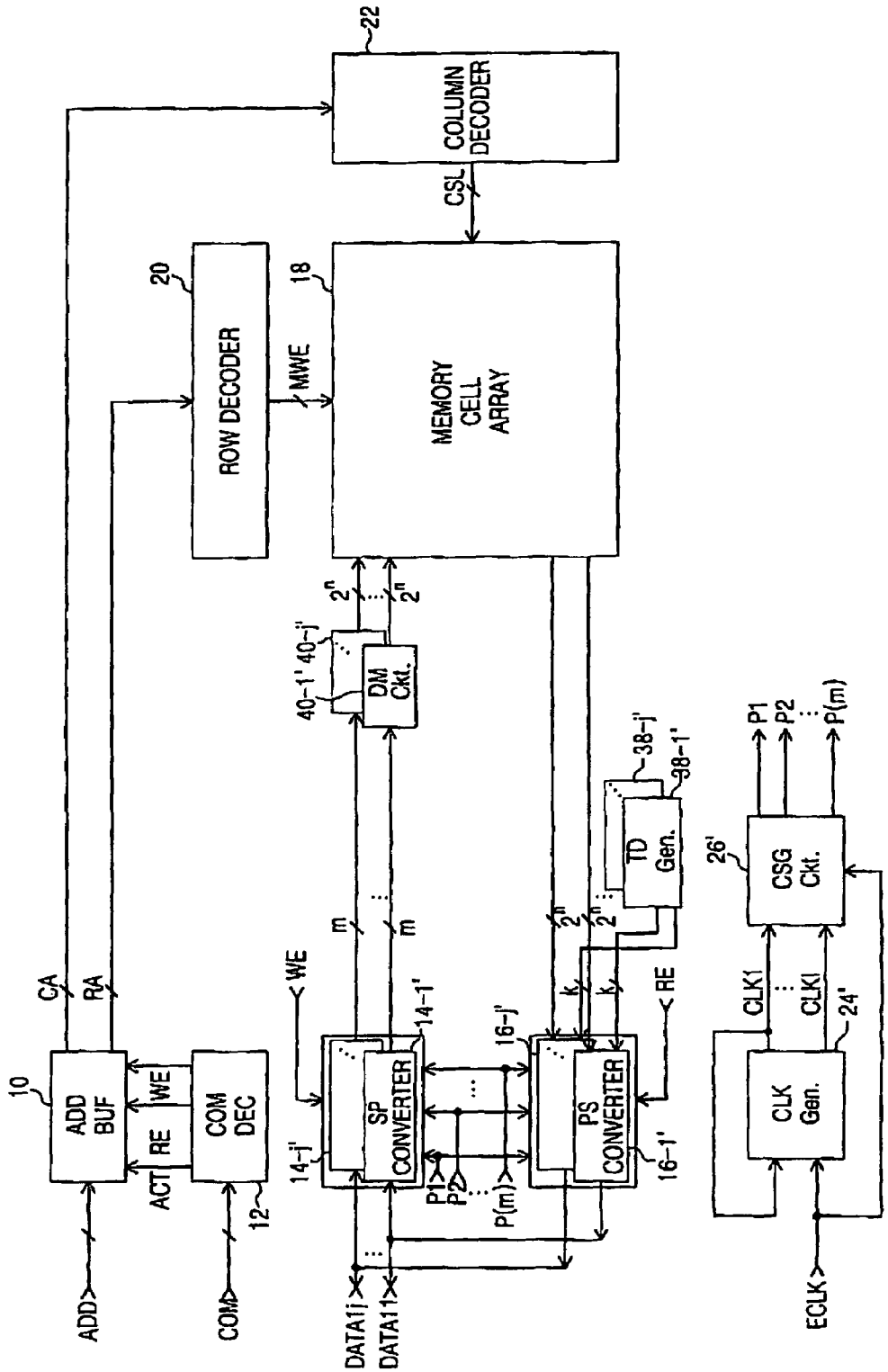
FIG. 19 illustrates a memory device in accordance with another example embodiment of the present invention.

FIG. 19 illustrates a memory device, including associated control logic, in accordance with another example embodiment of the present invention. As shown and as discussed above in conjunction with FIG. 5, the associated control logic may include one or more serial-to-parallel converters 14-1' to 14-j', one or more parallel-to-serial converters 16-1' to 16-j', a memory cell array 18, a clock generator (CLK Gen.) 24', and/or a control signal generation circuit (CSG Ckt.) 26'. The associated control logic may also include the conventional address buffer (ADD BUF) 10, command decoder (COM DEC) 12, a memory cell array 18, row decoder 20, and/or column decoder 22 of FIG. 1B.

Each serial-to-parallel converter (14-1' to 14-j') may receive serial data DATA composed of m bit data and output m bits of parallel data through m data bus lines, in response to a write command signal (WE) and a plurality of control signals (P1~P(m)). In addition, each of the serial-to-parallel converters (14-1' to 14-j') may be coupled to the memory cell array 18 via m data bus lines.

Each parallel-to-serial converter (16-1' to 16-j') may receive $2^n$ bit data from the memory cell array 18 in parallel and output m bit serial data responsive to a read command signal (RE) and the plurality of control signals (P1~P(m)).

The clock generator (CLK Gen.) 24' may receive the external clock signal ECLK and perform a locking operation to output an internal clock signal CLK1, which is locked with ECLK. After completing the locking operation, the clock generator (CLK Gen.) 24' may output a plurality of internal clock signals (CLK1~CLK1) to the control signal generation circuit (CSG Ckt.) 26'. The control signal generation circuit (CSG Ckt.) 26' may generate the plurality of control signals (P1~P(m)).

As shown in FIG. 16, the control signal generation circuit (CSG Ckt.) 26' generates a plurality of control signals (P1~P(m)). In an example embodiment, $m=2^n+k$. As a result, in an example embodiment of the present invention, one or more serial-to-parallel converters (14-1' to 14-j') and/or one or more parallel-to-serial converters (16-1' to 16-j') may also convert m data bits into a parallel or serial stream during one clock cycle of ECLK, in response to one or more control signals (P1~P(m)).

As shown in FIG. 19, a memory device, including associated control logic, in accordance with another example embodiment of the present invention may also include one or more temperature detector generators (38-1' to 38-j') and/or one or more data masking circuits (40-1' to 40-j'). Each data masking circuit (40-1' to 40-j') may further include one or more error switches SW1~SW($2^n$). In an example embodiment, the $2^n$ data bits are valid data writable to and readable from a memory cell array and the k data bits are mask data. In another example embodiment, the $2^n$ data bits are valid data writable to and readable from a memory cell array and the k data bits are data representing the state of the memory cell array, for example, temperature data, as described below.

As shown in FIG. 19, each of the one or more data masking circuits (40-1' to 40-j') receives the m bit data from the one or more serial-to-parallel converters (14-1' to 14-j') through the m data bus lines.

Each of the one or more data masking circuits (40-1' to 40-j') may mask a portion of the m bit data from the one or more serial-to-parallel converters (14-1' to 14-j') through the m data bus lines. For example, odd data (di1, di3, . . . ,) may be prevented from being written to the memory cell array 18 in response to k bits (where, for example, for 2 bits, k1=1 and k2=0) while even data (di2, di4, . . . ,) may be prevented from being written to the memory cell array 18 in response to k bits (where, for example, for 2 bits, k1=0 and k2=1).

Figure 20:
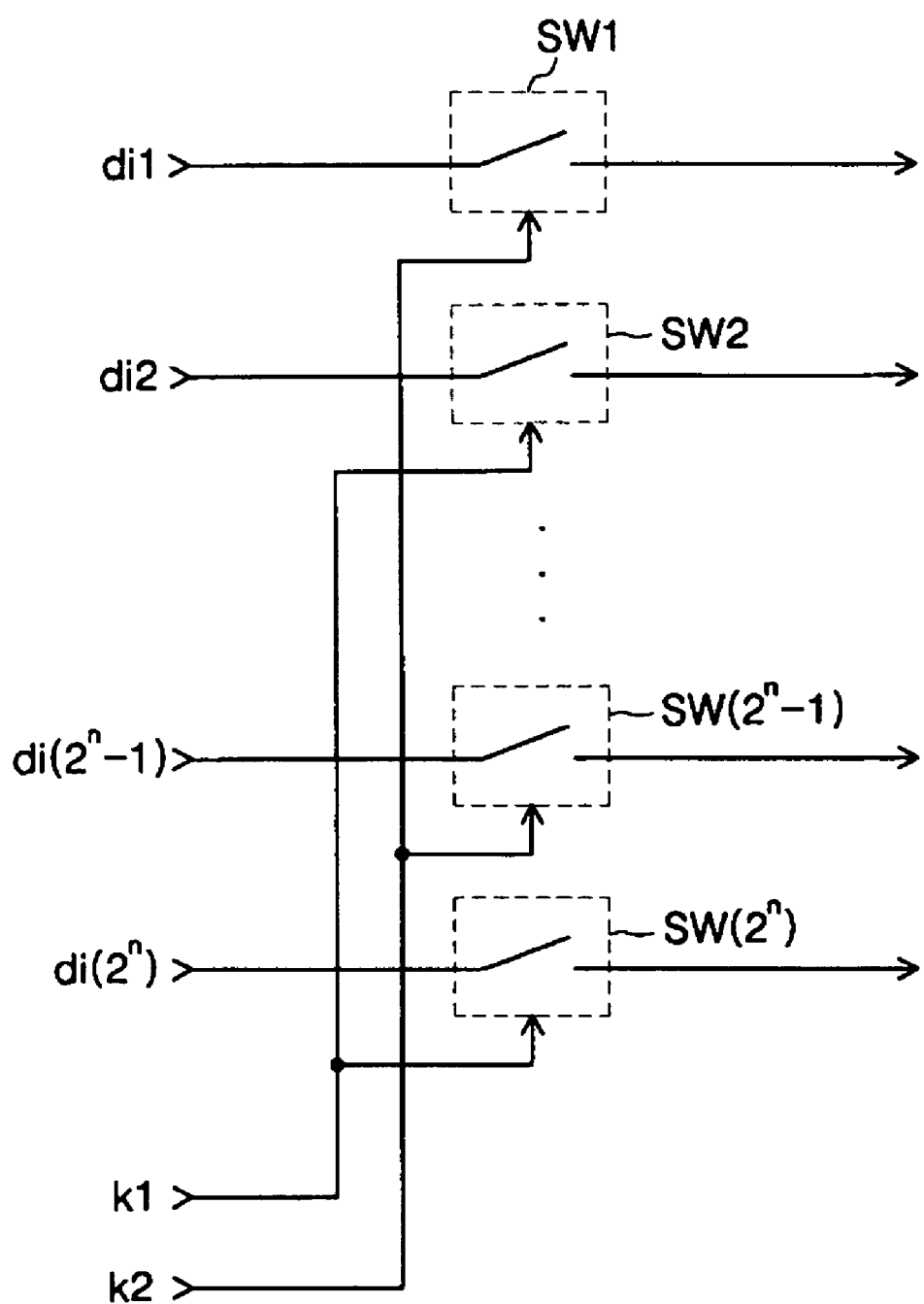
FIG. 20 illustrates a data masking circuit in accordance with another example embodiment of the present invention.

Also, when the k bits are "11", all of them input data may be written to the memory cell array 18 (essentially, no masking operation). As a result, a memory device, for example, any of the memory devices described above do not need data mask pins or pads. FIG. 20 illustrates a data masking circuits (40-j') where k=2 bits.

It is noted that the number of k bits may vary, and generally a higher number of bits provides better data masking resolution. For example, if the k bits data included three bits or four bits, the coverage of masking input data is better than that for two bits.

As also shown in FIG. 19, each of the one or more temperature detector generators (38-1' to 38-j') generates k bits of temperature information (for example), that are forwarded to each of the one or more parallel-to-serial converters (16-1' to 16-j'), where the k bits of temperature information from the one or more temperature detector generators (38-1' to 38-j') are combined with the $2^n$ bit data from the memory cell array 18 and output as a serial data stream DATA11~DATA1j.

Each of the one or more temperature detector generators (38-1' to 38-j') may output k bits data corresponding to a temperature measured by a temperature sensor (not shown) to each of the one or more parallel-to-serial converters (16-1' to 16-j'). Each of the one or more temperature detector generators (38-1' to 38-j') may include an A/D converter for converting an analog signal output by a temperature sensor into a digital signal.

As described above, each of the one or more data masking circuits (40-1' to 40-j') may mask none, some, or all of the $2^n$ parallel data to the memory cell array 18. Similarly, each of the one or more temperature detector generators (38-1' to 38-j') may generate k bits of temperature information which may be combined with the $2^n$ bit data from the memory cell array 18 and output as a serial data stream DATA11~DATA1j. It is noted that temperature detector generators and temperature information are only an example, and any type of data from any type of device could be combined and output with the $2^n$ bit data from a memory cell array and forwarded to a memory controller, for example the memory controller 100 of FIG. 1A.

Figure 21:
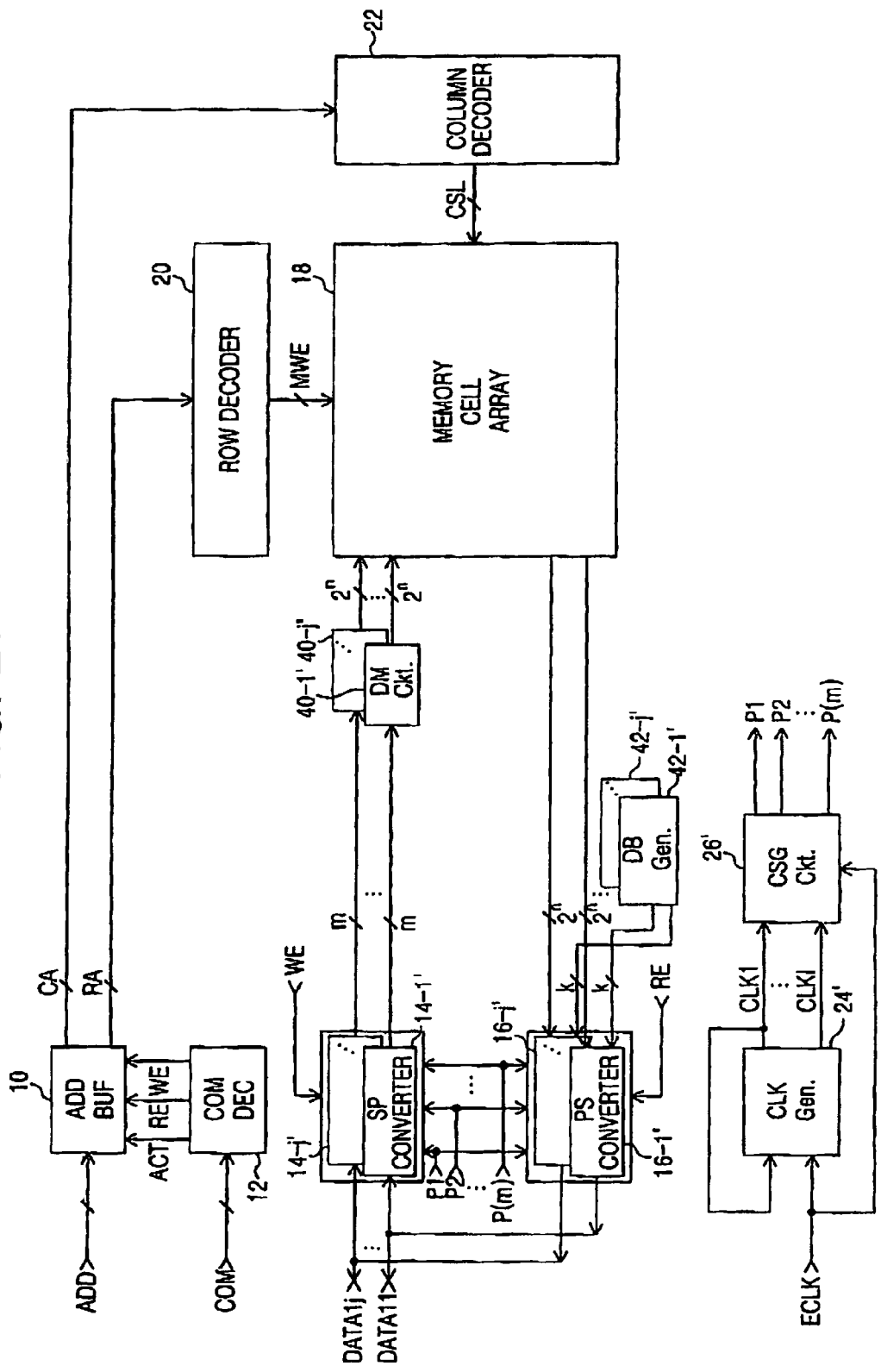
FIG. 21 illustrates a memory device in accordance with another example embodiment of the present invention.

FIG. 21 illustrates a memory device, including associated control logic, in accordance with another example embodiment of the present invention. As shown and as discussed above in conjunction with FIG. 5, the associated control logic may include one or more serial-to-parallel converters 14-1' to 14-j', one or more parallel-to-serial converters 16-1' to 16-j', a memory cell array 18, a clock generator (CLK Gen.) 24', and/or a control signal generation circuit (CSG Ckt.) 26'. The associated control logic may also include the conventional address buffer (ADD BUF) 10, command decoder (COM DEC) 12, a memory cell array 18, row decoder 20, and/or column decoder 22 of FIG. 1B.

Each serial-to-parallel converter (14-1' to 14-j') may receive serial data DATA composed of m bit data and output m bit parallel data through m data bus lines, in response to a write command signal (WE) and a plurality of control signals (P1~P(m)). In addition, each of the serial-to-parallel converters (14-j') may be coupled to the memory cell array 18 via m data bus lines.

Each parallel-to-serial converter (16-1' to 16-j') may receive $2^n$ bit data from the memory cell array 18 in parallel and output m bit serial data responsive to a read command signal (RE) and the plurality of control signals (P1~P(m)).

The clock generator (CLK Gen.) 24' may receive the external clock signal ECLK and perform a locking operation to output an internal clock signal CLK1, which is locked with ECLK. After completing the locking operation, the clock generator (CLK Gen.) 24' may output a plurality of internal clock signals (CLK1~CLK1) to the control signal generation circuit (CSG Ckt.) 26'. The control signal generation circuit (CSG Ckt.) 26' may generate the plurality of control signals (P1~P(m)).

As shown in FIG. 21, the control signal generation circuit (CSG Ckt.) 26' generates a plurality of control signals (P1~P(m)). In an example embodiment, $m=2^n+k$. As a result, in an example embodiment of the present invention, one or more serial-to-parallel converters (14-1' to 14-j') and/or one or more parallel-to-serial converters (16-1' to 16-j') may also convert m data bits into a parallel or serial stream during one clock cycle of ECLK, in response to one or more control signals (P1~P(m)). In another example embodiment, the $2^n$ data bits are valid data writable to and readable from a memory cell array and the k data bits are dummy data, as described below. As shown in FIG. 21, a memory device, including associated control logic, in accordance with another example embodiment of the present invention may also include one or more dummy bit generation circuits (42-1' to 42-j') and/or one or more data masking circuits (40-1' to 40-j'). Each data masking circuit (40-1' to 40-j') may further include one or more error switches SW1~SW(2").

As shown in FIG. 21, each of the one or more data masking circuits (40-1' to 40-j') may receive the m bit data from the one or more serial-to-parallel converters (14-1 to 14-j') through the m data bus lines. Example structure and example operation of the one or more data masking circuits (40-1' to 40-j') are described above in conjunction with FIG. 20.

Each of the one or more dummy bit generation circuits (42-1' to 42-j') may transfers k bits of dummy data (for example, data with a zero or Vcc value) to one or more parallel-to-serial converters (16-1' to 16-j') in a read operation.

It will be apparent to those skilled in the art that other changes and modifications may be made in the above-described example embodiments without departing from the scope of the invention herein, and it is intended that all matter contained in the above description shall be interpreted in an illustrative and not a limiting sense.

What is claimed is:

1. A memory devices, comprising:
    a memory cell array;
    a control signal generator circuit adapted to receive at least two internal clock signals and adapted to generate p control signals (where p is an integer≧3 and where p=$2^n$+k), where $2^n$ is a number of data bits (where n is an integer≧1) and k is a number of data bits (where k is an integer, k is≧1, and k is<$2^n$), all of the p control signals being generated sequentially during one clock cycle of an external clock signal;
    at least one serial-to-parallel converter, adapted to receive a serial bit stream of m bits (where m is an integer≧3) sequentially, and adapted to convert the serial bit stream of m bits into a parallel m-bit stream in response to each of the p control signals, all bits of the parallel m-bit stream being output during one clock cycle of the external clock signal, wherein at least the $2^n$ data bits can be written to the memory cell array; and
    at least one parallel-to-serial converter, adapted to receive at least a parallel $2^n$-bit stream read from the memory cell array and adapted to convert the parallel $2^n$-bit stream into a serial bit stream in response to each of $2^n$ control signals, all bits of the serial bit stream being output during one clock cycle of the external clock signal, wherein at least the $2^n$ data bits can be read from the memory cell array.

2. The memory device of claim 1, wherein the $2^n$ data bits are valid data writable to and readable from the memory cell array, and
    wherein the k data bits are valid data writable to and readable from the memory cell array.

3. The memory device of claim 1, wherein the $2^n$ data bits are valid data writable to and readable from the memory cell array, and
    wherein the k data bits are check data.

4. The memory device of claim 1, wherein the $2^n$ data bits are valid data writable to and readable from the memory cell array, and
    wherein the k data bits are mask data.

5. The memory device of claim 1, wherein the $2^n$ data bits are valid data writable to and readable from the memory cell array, and
    wherein the k data bits are dummy data.

6. The memory device of claim 1, wherein the at least one serial-to-parallel converter further receives a write enable signal to write at least the $2^n$ data bits to the memory cell array.

7. The memory device of claim 1, wherein the at least one parallel-to-serial converter further receives a read enable signal to read at least the $2^n$ data bits from the memory cell array.

8. The memory device of claim 1, wherein the at least one serial-to-parallel converter converts the serial bit stream of m bits into a parallel m-bit stream including the $2^n$ data bits and the k data bits, and
    wherein the parallel m-bit stream can be written to the memory cell array.

9. The memory device of claim 8, wherein the at least one parallel-to-serial converter converts the parallel m-bit stream into a serial bit stream of m bits that can be read from the memory cell array, and
    wherein the serial bit stream of m bits includes the $2^n$ data bits and the k data bits.

10. The memory device of claim 1, wherein the at least one serial-to-parallel converter converts the serial bit stream of m bits into a parallel m-bit stream including the $2^n$ data bits, and
    wherein the $2^n$ data bits can be written to the memory cell array.

11. The memory device of claim 10, wherein the at least one parallel-to-serial converter converts the parallel m-bit stream into a serial bit stream of m bits, and
    wherein the $2^n$ data bits can be read from the memory cell array.

12. The memory device of claim 10, further comprising:
    an error detection circuit adapted to receive the parallel m-bit stream from the at least one serial-to-parallel converter and adapted to generate a composite error detection signal.

13. The memory device of claim 12, the error detection circuit including:
    at least one error detector that includes:
        a divider adapted to receive the parallel m-bit stream from the at least one serial-to-parallel converter and adapted to generate a k bit signal; and
        an error decision circuit adapted to receive the k bit signal and adapted to generate an error detection signal; and
    an error detection signal generating circuit that combines the error detection signals from the at least one error decision circuit and that generates the composite error detection signal.

14. The memory device of claim 13, wherein the at least one error detector implements a parity check.

15. The memory device of claim 13, wherein the at least one error detector implements a cyclical redundancy check (CRC).

16. The memory device of claim 12, further comprising:
    an error detection code generating circuit adapted to receive the $2^n$ data bits from the memory cell array and adapted to generate at least one k-bit code.

17. The memory device of claim 16, the error detection code generating circuit including:
    at least one error detection code generator that includes:
        a shift register adapted to receive the $2^n$ data bits from the memory cell array and adapted to generate m bits; and
        a divider adapted to divide the m bits to generate the at least one k-bit code.

18. The memory device of claim 10, further comprising:
    a data masking circuit adapted to receive the parallel m-bit stream from the at least one serial-to-parallel converter and adapted to generate the $2^n$ data bits that can be written to the memory cell array.

19. The memory device of claim 18, the data masking circuit including:
a plurality of switches, each receiving the $2^n$ data bits and the k data bits from the at least one serial-to-parallel converter to mask at least one of the $2^n$ data bits.

20. The memory device of claim 19, wherein masking resolution increases as k increases.

21. The memory device of claim 18, further comprising:
at least one temperature detector generator that receives temperature information about the memory cell array and that outputs k bits of temperature information to the at least one parallel-to-serial converter.

22. The memory device of claim 19, further comprising:
at least one dummy bit generator that generates k dummy bits and that outputs the k dummy bits to the at least one parallel-to-serial converter.

23. A method of writing data to and reading data from a memory cell array, the method comprising:
receiving at least two internal clock signals and generating p control signals (where p is an integer$\geq 3$ and where $p=2^n+k$), where $2^n$ is a number of data bits (where n is an integer$\geq 1$) and k is a number of data bits (where k is an integer, k is$\geq 1$, and k is$<2^n$), all of the p control signals being generated sequentially during one clock cycle of an external clock signal;
receiving a serial bit stream of m bits (where m is an integer$\geq 3$) sequentially, and converting the serial bit stream of m bits into a parallel bit stream in response to each of the p control signals, all bits of the parallel bit stream being output during one clock cycle of the external clock signal, wherein at least the $2^n$ data bits can be written to the memory cell array; and
receiving at least a parallel $2^n$-bit stream read from the memory cell array and converting the parallel $2^n$-bit stream into a serial bit stream in response to each of $2^n$ control signals, all bits of the serial bit stream being output during one clock cycle of the external clock signal, wherein at least the $2^n$ data bits can be read from the memory cell array.

24. A memory systems, comprising:
a memory module including a plurality of memory devices, each memory device including a memory cell array, each memory device including:
a control signal generator circuit adapted to receive at least two internal clock signals and adapted to generate p control signals (where p is an integer$\geq 3$ and where $p=2^n+k$), where $2^n$ is a number of data bits (where n is an integer$\geq 1$) and k is a number of data bits (where k is an integer, k is$\geq 1$, and k is$<2^n$), all of the p control signals being generated sequentially during one clock cycle of an external clock signal;
at least one serial-to-parallel converter adapted to receive a serial bit stream of m bits (where m is an integer$\geq 3$) sequentially, and adapted to convert the serial bit stream of m bits into a parallel bit stream in response to each of the p control signals, all bits of the parallel bit stream being output during one clock cycle of the external clock signal, wherein at least the $2^n$ data bits can be written to the memory cell array;
at least one parallel-to-serial converter, adapted to receive at least a parallel $2^n$-bit stream read from the memory cell array and adapted to convert the parallel $2^n$-bit stream into a serial bit stream in response to each of $2^n$ control signals, all bits of the serial bit stream being output during one clock cycle of the external clock signal, wherein at least the $2^n$ data bits can be read from the memory cell array; and
a memory controller adapted to supply the external clock signal to a phased locked loop of each of the plurality of memory devices so each of the phased locked loops may generate the at least two internal clock signals provided to the control signal generator circuit, and adapted to supply a command signal and an address signal to read the at least $2^n$ data bits from any of the plurality of memory devices and to write the at least $2^n$ data bits to any of the plurality of memory devices.

* * * * *